US012218700B2

(12) United States Patent
Stewart et al.

(10) Patent No.: US 12,218,700 B2
(45) Date of Patent: Feb. 4, 2025

(54) PORTABLE MONITORING AND SENSING DEVICE FOR CONSTRUCTION SITES

(71) Applicants: David Stewart, Williamsville, NY (US); Joseph Thomas Jones Stewart, II, Williamsville, NY (US)

(72) Inventors: David Stewart, Williamsville, NY (US); Joseph Thomas Jones Stewart, II, Williamsville, NY (US)

( * ) Notice: Subject to any disclaimer, the term of this patent is extended or adjusted under 35 U.S.C. 154(b) by 292 days.

(21) Appl. No.: 17/648,647

(22) Filed: Jan. 21, 2022

(65) Prior Publication Data

US 2022/0231718 A1 Jul. 21, 2022

Related U.S. Application Data

(60) Provisional application No. 63/140,011, filed on Jan. 21, 2021.

(51) Int. Cl.
*H04B 1/3827* (2015.01)
*G06F 1/20* (2006.01)
*H05K 7/20* (2006.01)

(52) U.S. Cl.
CPC ........... *H04B 1/3827* (2013.01); *G06F 1/203* (2013.01); *G06F 1/206* (2013.01); *H05K 7/20136* (2013.01); *H05K 7/20209* (2013.01); *H05K 7/2039* (2013.01)

(58) Field of Classification Search
CPC ........ G06F 1/1628; G06F 1/203; G06F 1/206; H04B 1/3827; H05K 5/06; H05K 7/20136; H05K 7/202; H05K 7/20209; H05K 7/2039
See application file for complete search history.

(56) References Cited

U.S. PATENT DOCUMENTS

| | | | |
|---|---|---|---|
| 5,590,024 A * | 12/1996 | Honda | G06F 1/1667 361/679.32 |
| 7,746,223 B2 | 6/2010 | Howarter et al. | |
| 8,188,861 B2 | 5/2012 | Pederson | |
| 8,493,223 B2 | 7/2013 | Zadnikar et al. | |
| 8,552,863 B2 | 10/2013 | Kumbhar et al. | |
| 8,730,040 B2 | 5/2014 | Donovan et al. | |
| 9,098,954 B1 | 8/2015 | Byrd | |
| 9,235,754 B2 | 1/2016 | Oami et al. | |
| 10,205,913 B2 | 2/2019 | Smith et al. | |
| 10,529,221 B2 | 1/2020 | Jarrell et al. | |

(Continued)

*Primary Examiner* — Nguyen T Vo
(74) *Attorney, Agent, or Firm* — Simpson & Simpson, PLLC

(57) ABSTRACT

A portable worksite monitoring and communication device, including a weatherproof sealed container, further comprising, a container portion having an internal cavity, a removable cover arranged to lockably seal the internal cavity, and a heat sink opening, a heat sink apparatus sealably secured within the heat sink opening, a plurality of electronic connectors, a computing device in communication with a cellular modem, the cellular modem in communication with a cloud network, the computing device in communication with the plurality of electronic connectors, a display in communication with the computing device, and, a plurality of communication configurations in communication with the computing device, wherein the heat sink apparatus is arranged to programmably activate or automatically activate.

13 Claims, 19 Drawing Sheets

(56) References Cited

U.S. PATENT DOCUMENTS

| | | | |
|---|---|---|---|
| RE49,124 E * | 7/2022 | Arnouse | G06F 1/1658 |
| 2005/0110634 A1 | 5/2005 | Salcedo et al. | |
| 2008/0177646 A1 | 7/2008 | Frink | |
| 2017/0295640 A1* | 10/2017 | Tsunoda | H04M 1/0202 |
| 2018/0249133 A1* | 8/2018 | Thiel | G08B 25/016 |
| 2022/0021953 A1* | 1/2022 | Moser | H04Q 9/00 |
| 2023/0284412 A1* | 9/2023 | Suonmaa | H01H 85/47 |
| | | | 361/688 |
| 2023/0363104 A1* | 11/2023 | Narasimhan | H05K 7/20163 |

* cited by examiner

PORTABLE MONITORING AND SENSING DEVICE FOR CONSTRUCTION SITES

CROSS-REFERENCE TO RELATED APPLICATIONS

This application is a U.S. Nonprovisional Patent Application filed pursuant to 35 U.S.C. § 111, which application claims priority to U.S. Provisional Patent Application No. 63/140,011, filed Jan. 21, 2021, which application is incorporated herein by reference in its entirety.

FIELD

The present invention relates generally to a sealed portable monitoring and communication device for construction sites. More particularly, this invention relates to a portable device having a weatherproof and portable container configured to provide a wide area network, local area network, cellular network and communication system with an offsite cloud network configured for tracking work site employees and/or tools, communicating with a plurality of on-site sensors and devices or employee devices, and providing reporting on collected data, where the portable monitoring and communication device also includes a space conscious heat management system that does not compromise the weatherproof nature of the device.

Computer Program Listing Appendix

The present application includes a computer program listing appendix. The computer program listing is intended to comprise a part of the complete written description of the invention pursuant to 35 U.S.C. § 112. The appendix contains ASCII text files of the computer program as follows:

| Name | Date Created | Size |
| --- | --- | --- |
| Fortress_main_module.txt | Jan. 5, 2022 7:01 AM | 73 KB |

BACKGROUND

According to Aon Construction Services Group's Risk Advisory report in 2019, between 2017 to 2018, construction insurance claims totaled $237 billion in private and public insured losses. These losses include workplace accidents, natural disasters, fires, and other related construction incidents that were subject to insurance claims.

In order for construction companies, project managers, contractors to reduce their insurance premiums, many of these entities either structure long-term deals or opt to take an increase on claims excess (i.e., deductibles). However, the most effective way to reasonably manage these costs comes from good risk management and claims management. One of the simple ways to effectively manage risks and claims is through demonstration of better than average safety management structures. These measures include having information on in-house safety management capabilities, demonstrating industry accepted safety awards and employee safety certifications, worksite monitoring, and/or demonstrating accurate, fast and effective safety reporting.

Various attempts to provide decreased insurance costs have been developed through various methods of monitoring a worksite including a plurality of external components arranged throughout the entirety of a worksite requiring interconnections via wired means and also wireless means. One solution contemplated a remote-worksite monitoring and employee time tracking system and method, including the various external components. For a building under construction the system uses an IP camera that is interfaced with the internet through an internet connection via a broadband modem and wireless router. A fixed wireless IP camera is positioned to stream images of the work site that are outside the view of the IP camera. A low power radio network that comprises, transceivers, interfaced with sensors, and a global positioning system module that communicates over the low power radio network. If the worksite equipment is moved outside a boundary, an alarm is sent through the transceivers to an internet bridging device (IBD), a router and the broadband modem to the internet. The system also comprises a sensor for detecting other physical or chemical properties, e.g., a water leak or biological activity. A plurality of camera sensors also interfaces with the transceivers to provide video. The low power radio network also includes an IBD for passing data over the internet to and from the transceivers. The invention also includes RFID tags, that may be attachable to items of value that also pass tag identification data through the transceivers to the IBD, the router and the broadband modem to the internet. A server receives and processes the data transmitted through a low power network. Additionally, a client computer displays data processed by the server. The system also includes a biometric fingerprint scanner (BFS) interfaced with the internet. The BFS is used by work site employees to check-in and check-out of the work site. The server stores each employee's identification along with their work site check-in and check-out time. However, the system lacked simplification in the interconnection of all of the external components and did not provide for efficient modularity and transportation.

Another attempted solution provided an invention that discloses a security and control system. In one embodiment, the system is mobilized via a housing positioned on a trailor. The trailer housing comprises, an environmental control unit, a power supply, a communication dish that can provide bidirectional communication with the internet or another network. The housing further comprises, a camera, a processor, alarms or beacons, various lighting fixtures and, a log in/log out device. In a preferred embodiment, the invention included a card reader with a keypad for the log in/log out device. Also included in the housing is a RFID transmitter/receiver that is also mounted on, or within, the housing and can also communicate with the processor and the network. The system further includes a battery, which may comprise external batteries, a generator, a wind turbine, and/or solar panel to provide power to the system.

Although various systems have been devised that aid in lowering worksite insurance costs, there is a long-felt need for a simpler, modular and transportable device that provides all the necessary features of worksite monitoring while still allowing expansion of external devices to fit the needs of specific worksites and providing an internet network to facilitate instantaneous communication of collected worksite data. There is also a long felt need for a system capable of communicating easily to hand-held devices of contractors and employees from a singular on-site device.

Previous Insufficient Solutions and Problems Addressed by the Invention

It should be appreciated that heat management of electronic devices has always been a constant problem. It is well understood that circuit systems within electronics work best at lower temperatures. Allowing electronic systems to run for prolonged periods of time in high temperature environments can decrease the longevity and reliability of devices—the hotter the temperature, the less functional the device will become. For example, Apple's iPhone® will automatically shut off and display the warning, "Temperature. iPhone® needs to cool down before you can use it".

Previous attempts to provide for a modular and sealed worksite monitoring device have failed to provide a solution to the temperature management issue. One contemplation involved creating a non-sealed modular device which although encouraged ambient airflow, assisted by fans, introduced another problem—dust and particulate exposure to the internal electronics. Additional dust and particulate exposure create individual issues with electronics and exacerbates temperature management issues. Dust and particulates accumulate inside sockets, ports, and other in-betweens of electronic products. If a barrier of dust and particulates accumulates it may lead to overheating through insulation, moisture retention, conductivity problems, poor contact in relays, switches, and conductors, increased difficultly to repair, and may also cause arcing and carbon tracking in higher voltage appliances.

Other previous attempts to provide for a modular and sealed worksite monitoring device included utilizing a steel enclosure. Steel enclosures attract more heat and are particularly susceptible to heat soak, and radiant air, while still attracting heat from the internal electronic components. Steel enclosures heat soak, and once warm, they take a considerably long time to dissipate the heat retained. One solution was to insulate the steel enclosure with R10 foam board. The insulation initially sheltered the internal electronics from the heat, the insulation did not cure, nor manage the heat soak from solar gains applied to the steel enclosure. Eventually the enclosure was constructed from aluminum that provided for a decreased rate of heat soak. However, the aluminum enclosure was still limited to placement in non-sun-exposed areas even with the addition of internal fans which also introduced dust and particulates to the internal electronics. Other cooling options, such as active or forced cooling (A/C) or geothermal piping were cost prohibitive and necessarily required additional components making the device less modular. Additionally, the steel/aluminum enclosure was two (2) square feet in size and had considerable weight.

In further previous attempts to provide for a modular and sealed worksite monitoring device, the previously attempted steel/aluminum enclosures were abandoned for a plastic-type enclosure. Initially, no ventilation was provided and quickly resulted in a failure of functionality. An external port with ventilation was added to the plastic enclosure to intake and extract air. The intakes clogged with a normal environment and would excessively clog in a construction or high dirt/dust environment, with or without filtration in the port. To overcome clogging, airflow to the fan was increased but excessive noise became an issue. Eventually, without regular maintenance, the fan array would become completely clogged with dust and debris, ultimately resulting in functionality failure from either temperature and/or dust/particulate contamination.

As discussed above, when electronic components are contained in a sealed atmosphere managing temperatures to remain below a failing threshold requires additional cooling components. The additional cooling components either increase the size of the device, i.e., making it less modular, or required a standalone HVAC system, i.e., requiring additional necessary components on a worksite. Previous attempts were large and less-modular enclosures. Thus, there is a long felt need for an effective, yet space efficient temperature management system for a modular worksite monitoring device without external temperature management systems.

SUMMARY

The present invention generally comprises a portable worksite monitoring and communication device, comprising a weatherproof sealed container, further comprising a container portion having an internal cavity, a removable cover arranged to lockably seal the internal cavity, and a heat sink opening, a heat sink apparatus sealably secured within the heat sink opening, a plurality of electronic connectors, a computing device in communication with a cellular modem, the cellular modem in communication with a cloud network, the computing device in communication with the plurality of electronic connectors, a display in communication with the computing device, and, a plurality of communication configurations in communication with the computing device, wherein the heat sink apparatus is arranged to programmably activate or automatically activate.

The present invention also describes a monitoring camera that includes a plurality of components to provide for a variety of communication protocols in addition to specific sensors.

A primary object of the present invention is to provide a device that supports a worksite monitoring and an offsite cloud network within a singular and portable unit.

A secondary object of the present invention is to provide a device that may connect with external sensors, cameras, alarms and receive data therefrom to transmit to a cloud network or store on an internal memory.

A further object of the present invention is to provide a device that includes a transceiver arranged to log short-range tags located external to the device and to transmit the log to a cloud network or store the log on an internal memory.

Still another object of the present invention is to provide a device that supports a worksite monitoring and remote network system within a singular unit that is ruggedized, weatherproof, customizable for desired features, and deployment ready as soon as the device is connected to power and turned on. The additional features may include RFID tag tracking, in-unit computing capabilities, a cellular network providing antenna, a visual display, a plurality of external electronic inputs for wired device expansion, removable panels for feature customization, tamper-proof and lockability of the device's housing, and various additional components.

These and other objects, features, and advantages of the present invention will become readily apparent upon a review of the following detailed description of the invention, in view of the drawings and appended claims.

BRIEF DESCRIPTION OF THE DRAWINGS

Embodiments of the present invention are described in detail below with reference to the following drawings. These and other features, aspects, and advantages of the present invention will become better understood with regard to the following description, appended claims, and accompanying drawings. The drawings described herein are for illustrative purposes only of selected embodiments and not all possible implementations and are not intended to limit the scope of the appended claims. In the drawings:

DETAILED DESCRIPTION

Figure 1:
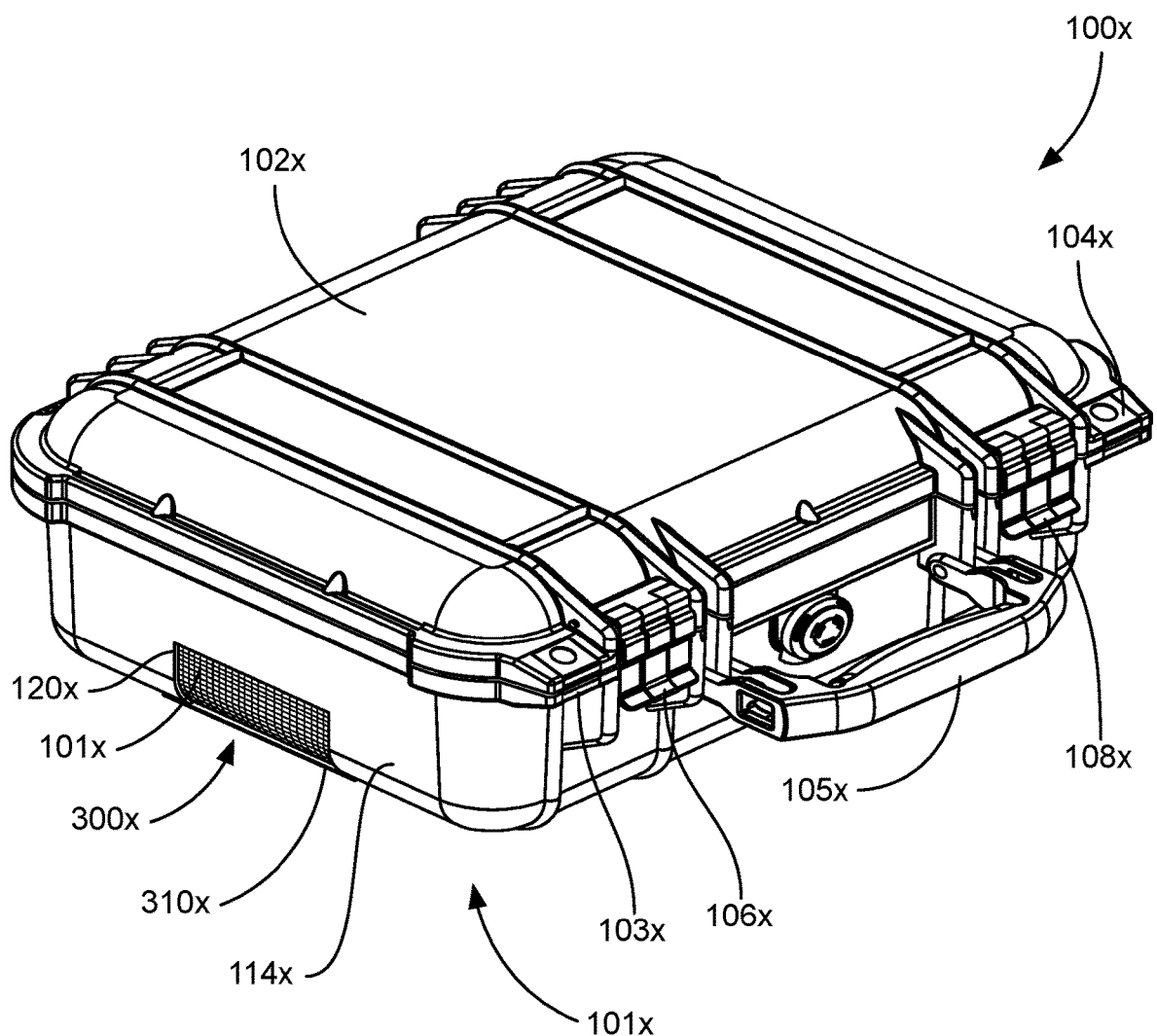
FIG. 1 illustrates a front-left perspective view of the present invention in a closed configuration.

At the outset, it should be appreciated that like drawing numbers on different drawing views identify identical, or functionally similar, structural elements. It is to be understood that the claims are not limited to the disclosed aspects.

Furthermore, it is understood that this description is not limited to the particular methodology, materials and modifications described and as such may, of course, vary. It is also understood that the terminology used herein is for the purpose of describing particular aspects only and is not intended to limit the scope of the claims.

Unless defined otherwise, all technical and scientific terms used herein have the same meaning as commonly understood to one of ordinary skill in the art to which this invention pertains. It should be understood that any methods, devices or materials similar or equivalent to those described herein can be used in the practice or testing of the example embodiments.

It should be appreciated that the term "substantially" is synonymous with terms such as "nearly," "very nearly," "about," "approximately," "around," "bordering on," "close to," "essentially," "in the neighborhood of," "in the vicinity of," etc., and such terms may be used interchangeably as appearing in the specification and claims. It should be appreciated that the term "proximate" is synonymous with terms such as "nearby," "close," "adjacent," "neighboring," "immediate," "adjoining," etc., and such terms may be used interchangeably as appearing in the specification and claims. Specifically, the terms "communicate," "communicates," "communication," or "in communication" should be view in respect to an electronic transfer of information or a transfer of electricity where applicable. Further, the term "data" should be construed as a signal that may be processed to aggregate data corresponding with the signal when it is specifically mentioned in relation to communications involving the separate antenna, unless otherwise specified.

It should also be appreciated that the directional terms, e.g., "upward", "top", "downward", "bottom", "rightward", "leftward", and similar variations thereof, pertain to the corresponding figures described herein as they are illustrated. For example, "component X being positioned rightwardly relative to component Y", means that "component X" is located to the right of "component Y" with respect to the drawing to which it pertains.

Adverting now to the figures, FIG. 1 illustrates a front-left perspective view of the present invention, specifically the present invention in a closed configuration. Portable monitoring and communication device 100x (hereinafter "portable device 100x") is displayed in a closed configuration, that is, lid 102x is closed and sealed to main body 101x of portable device 100x. Lid 102x is preferably hingedly attached to main body 101x. Lid 102x also includes first latch 106x and second latch 108x. First latch 106x and second latch 108x are arranged to sealably close lid 102x on main body 101x, creating a weatherproof seal within portable device 100x. It should be appreciated that the combination of main body 101x and lid 102x are preferably a rugged plastic-type construction, and may be comprised of stainless steel, hardened plastic, polymer, metal, alloy, or epoxy composite of varying materials offering rugged protection from workplace bumps, drops, scrapes, dust, and environmental elements including but not limited to dust, debris, wind, objects, insects and animals, precipitation, and tampering from individuals. It should also be appreciated that main body 101x in an alternative embodiment may include a plurality of wheels fixed to an external surface. Main body 101x and lid 102x are arranged to sealably store all the necessary components needed to instantly activate and use portable device 100x upon connecting a power source and switching the device on, detailed infra, while in a weatherproof and tamper-proof sealed manner. Main body 101x and lid 102x, when closed, may be waterproof, that is, completed sealed from the outside environment.

Figure 6:
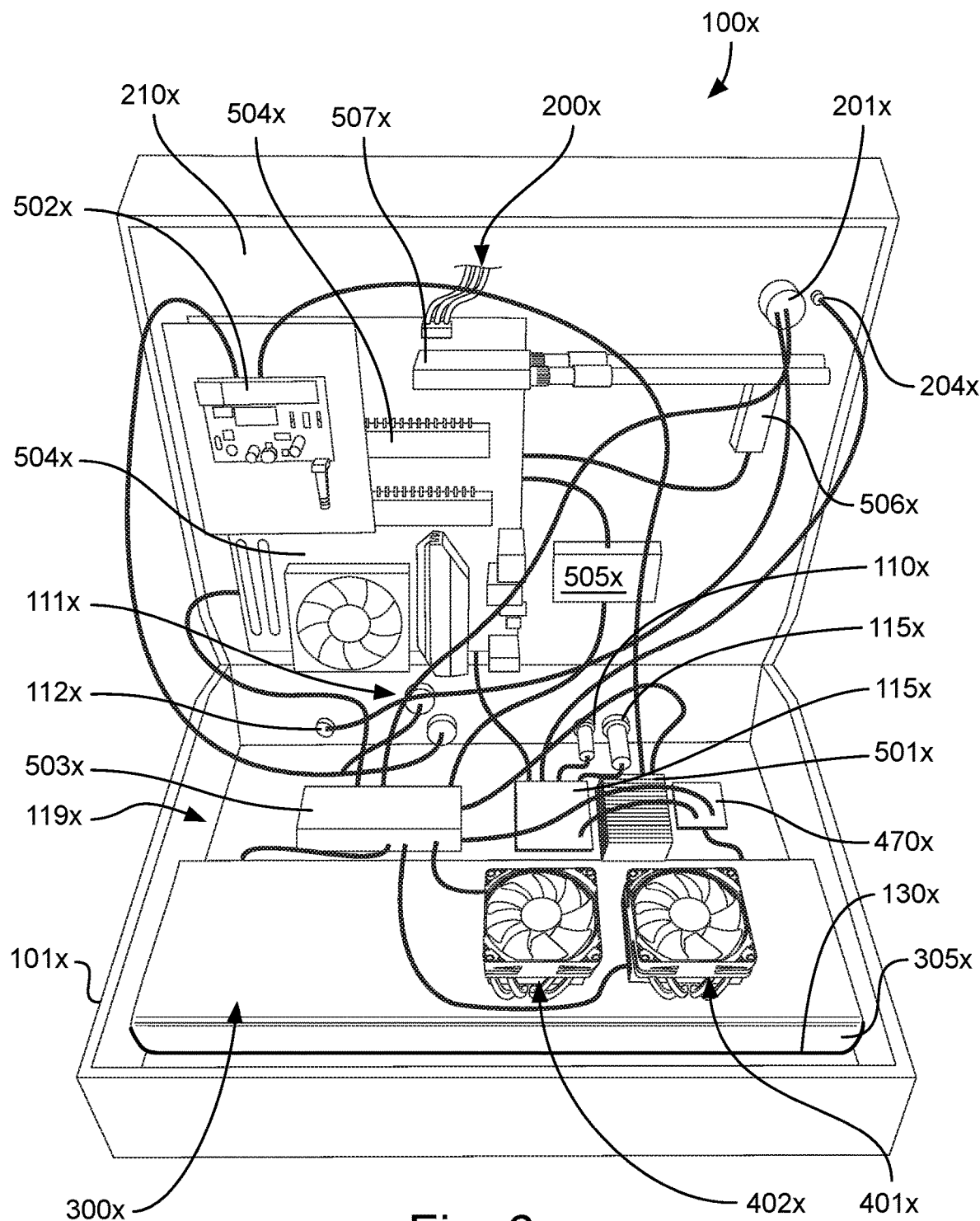
FIG. 6 illustrates a front perspective view of the present invention with display panel 210x opened to show internal cavity 119x.

Main body 101x includes heat sink channel 120x which is arranged to accept heat sink apparatus 300x therein (shown in FIG. 6). Heat sink channel 120x is formed by a cut out of two opposite external sides of main body 101x and a cut out of the bottom surface of main body 101x that extends to both cut outs of the opposite sides of main body 101x. When heat sink apparatus 300x is engaged to heat sink channel 120x it is sealably secured within heat sink channel 120x to preserve the sealed and weatherproof nature of portable device 100x, discussed further, infra. Heat sink channel 120x may also include mesh cover 121x that is arranged to cover both openings of heat sink channel 120x and cover 310x at the opposite sides of sidewall 114x of main body 101x.

Portable device 100x is approximately 15"×8.25"×19" to afford ease of transportation. Portable device 100x may also comprise a one-way water exit port, preferably located on bottom surface 113x of main body 101x (shown in FIG. 3), in case the weatherproof seal of portable device 100x has been compromised.

Figure 2:
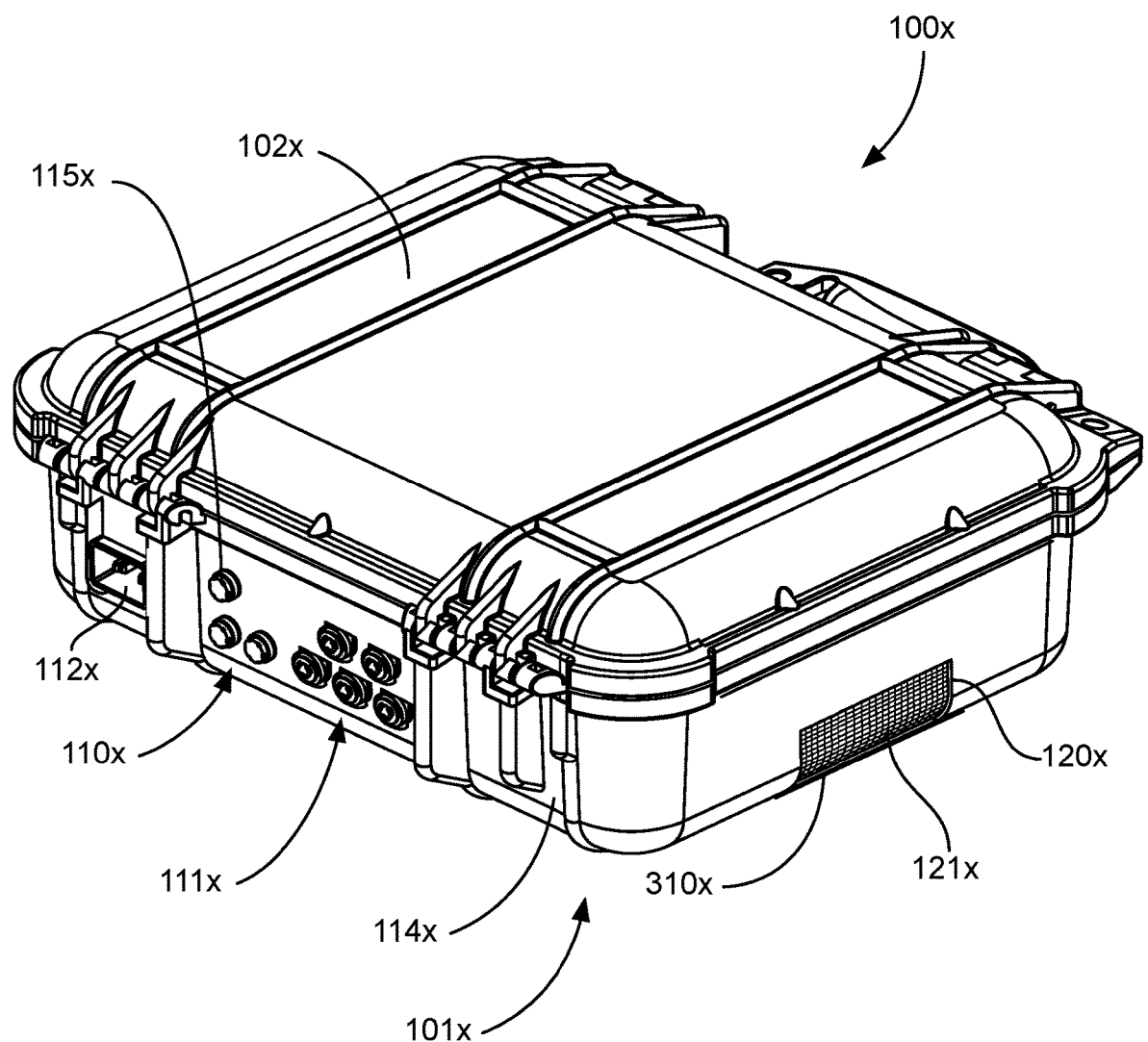
FIG. 2 illustrates a rear-left perspective view of the present invention in a closed configuration.

FIG. 2 illustrates a rear-left perspective view of the present invention, specifically the present invention in a closed configuration. Shown on sidewall 114x of main body 101x are plurality of indicator lights 110x, plurality of input/output connectors 111x, power source input 112x, and siren 115x. It should be appreciated that plurality of indicator lights 110x, plurality of input/output connectors 111x, siren 115x, and power source input 112x may be located anywhere on the external surface of main body 101x. plurality of input/output connectors 111x, may be any combination of necessary electronic input/outputs connections, e.g., USB, AVI, HDMI, coaxial, LAN, power over ethernet (POE), 120V line, etc. Plurality of input/output connectors 111x are arranged to interface with the internal electronic components within portable device 100x and may serve as inputs for commands or outputs to retrieve and export information stored on the internal components, or may be used to provide power to external components. Plurality of input/output connectors 111x may also be arranged to connect via hardwire to external components to portable device 100x, such as a power over ethernet connection to interface with a camera for power and video data transfer. In a preferred embodiment, plurality of input/output connectors 111x may also have a threadably secured weatherproof cap that securely encloses the externally facing surface of plurality of input/output connectors 111x when an individual connector is not in use. The plurality of input/output connectors 111x may also include serial ports, such as RS485 serial interface connectors and/or RS232 serial interface connectors. Siren 115x is in communication with a logic board (shown in FIG. 6) and is arranged to provide audio and/or visual alerts upon initiation from the logic board.

Figure 3:
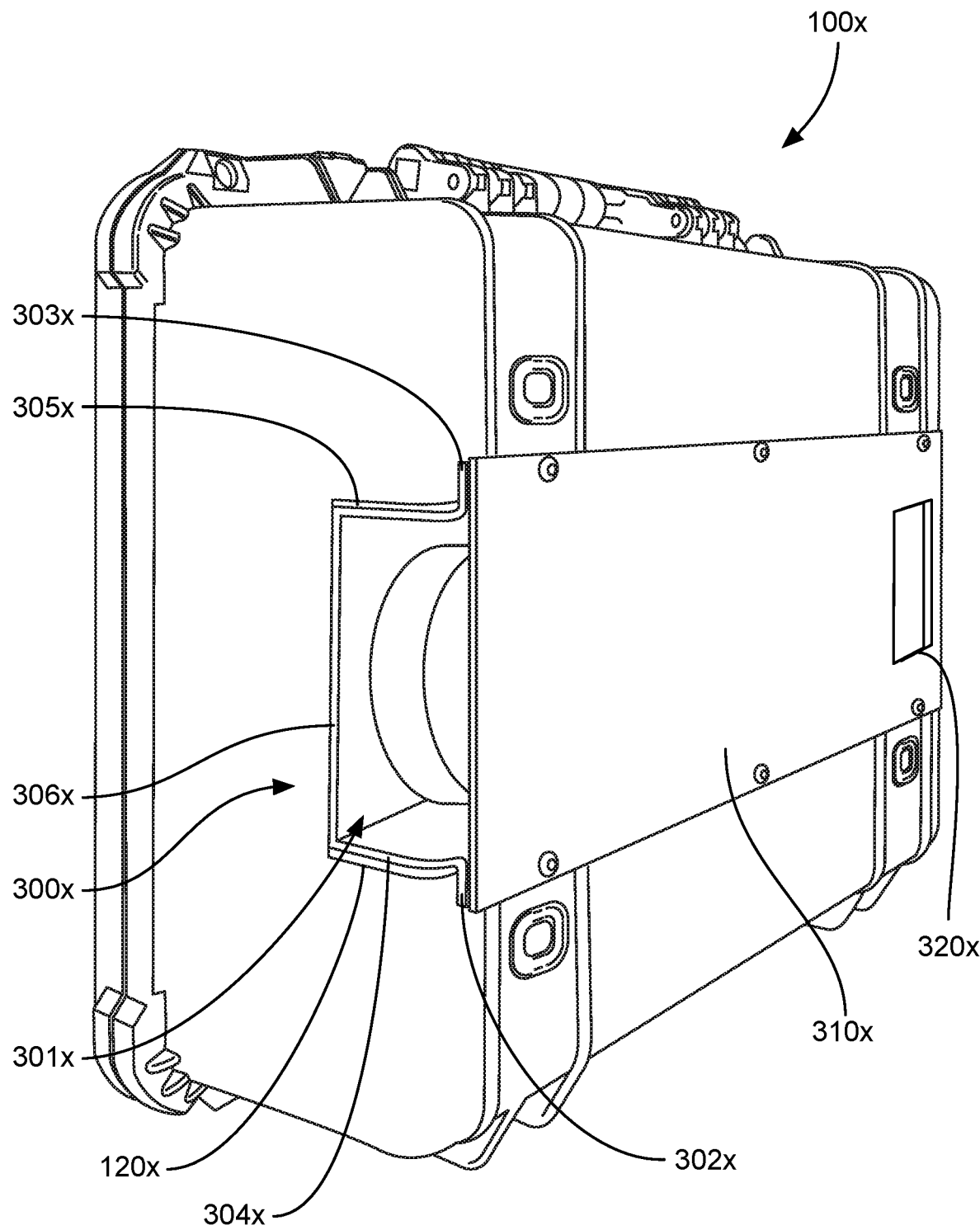
FIG. 3 illustrates a bottom-left perspective view of the present invention.

FIG. 3 illustrates a bottom-left perspective view of the present invention, specifically showing heat sink apparatus 300x and heat sink apparatus cover 310x, with mesh cover 121x removed from heat sink channel 120x. Heat sink apparatus comprises U-shaped channel 301x, cover 310x, and a plurality of internal components discussed infra. U-shaped channel 301x comprises mounting plate 306x which has two sidewalls, first sidewall 304x and second sidewall 305x extending therefrom. Extending from first sidewall 304x and second sidewall 305x are first shelf 302x and second shelf 303x, respectively. First shelf 302x and second shelf 303x are arranged to be removably secured to bottom surface 113x of main body 101x, proximate to the edges of heat sink channel 120x. Cover 310x is arranged to be removably secured to the outer surfaces of first shelf 302x and second shelf 303x, covering the internal components secured to mounting plate 306x. Arranged on the outside surface of cover 310x is mounting cleat 320x. Mounting cleat 320x in a preferred embodiment is a French cleat and allows for portable device 100x to be mounted on an external structure to keep portable device 100x off of the ground. It should be noted that mounting cleat 320x may be replaced with other suitable mounting means, e.g., bracketed, known in the art bracketing systems, and/or threadable means. Alternatively, lockable mounting means are also suitable alternatives to prevent theft and tampering.

Figure 4:
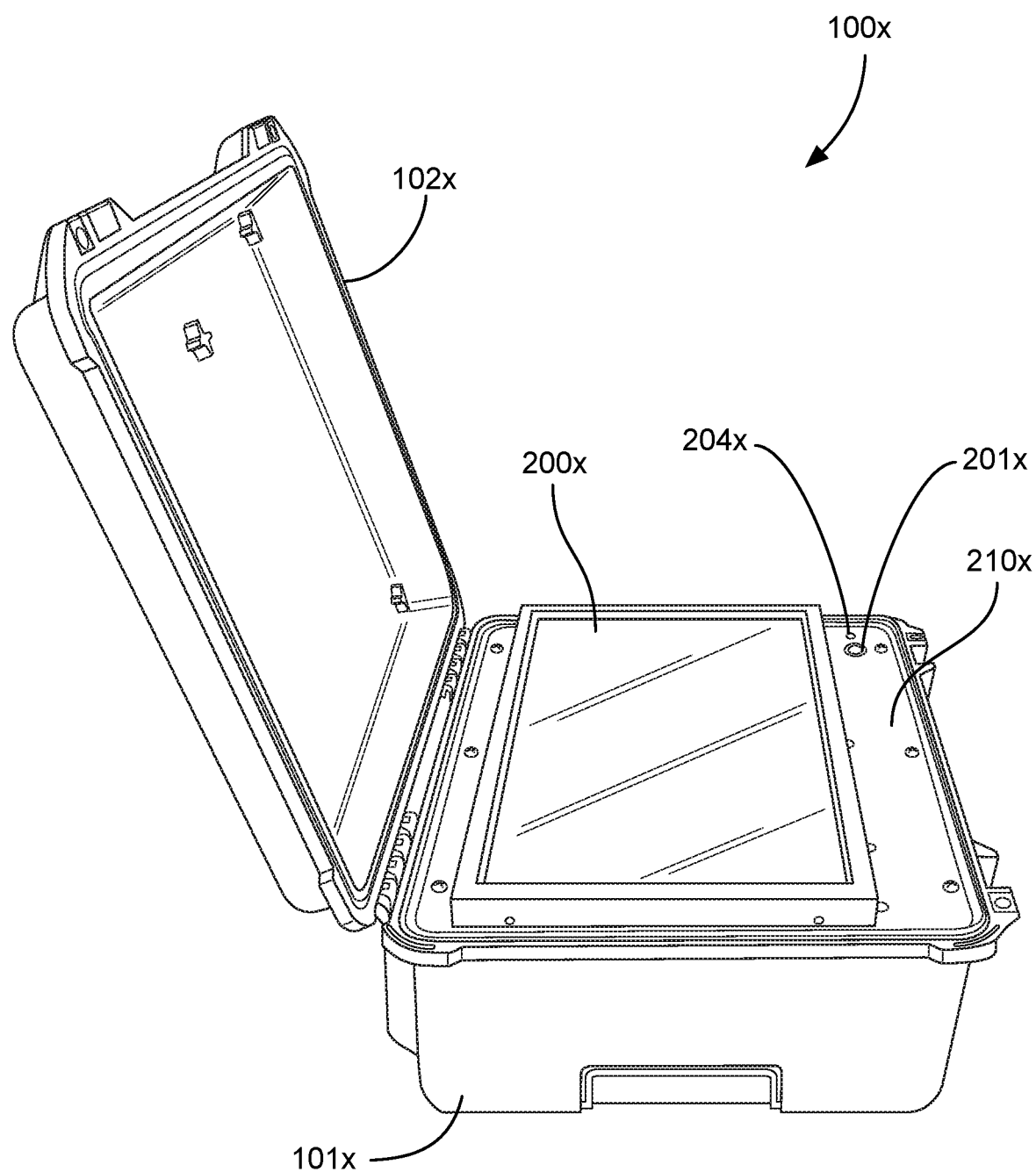
FIG. 4 illustrates a left perspective view of the present invention in an open configuration.

FIG. 4 illustrates an exemplary perspective view of the present invention in an open configuration. Seated within the internal cavity of main body 101x is display panel 210x. Display 210x may be secured to a ridge, shelf, or a plurality of protrusions within the internal cavity of main body 101x. Display panel 210x may be threadably secured, hingedly secured, or slideably secured to and within the internal cavity of main body 101x. Depending on the worksite conditions, it may be advantageous for display panel 210x to be threadably secured with main body 101x in order prevent tampering, or inversely, it may be necessary to hingedly secure display panel 210x within main body 101x in order to allow access to the internal cavity of main body 101x and the respective electronic components that may be secured to the underside of display panel 210x. In a preferred embodiment, display 200x is positioned on the external face of display panel 210x such that when lid 102x is opened, display 200x is readily accessible. Display 200x in a preferred embodiment is a touch-screen display, such as the Elo 294L Open Frame Touchscreen Display that may be purchased through elotouch.com, or may comprise other comparable touch-screen displays. Display panel 210x also includes power button 201x—initiating power-up of portable device 100x, its respective internal components, 4G/5G/LTE connectivity, and connectivity of the offsite cloud mainframe, discussed further, infra. Display panel 210x is also illustrated to show indicator light 204x, which may be a plurality of indicator lights to signify a variety of status signals, e.g., internal temperature, failure warning, connectivity, alerts, etc. Display 200x may also comprise a plurality of inputs and outputs, e.g., USB, coaxial, HDMI, display port, to allow for a plurality of components to connect to display, e.g., external keyboard, external mouse, external hard drive, etc.

Figure 5:
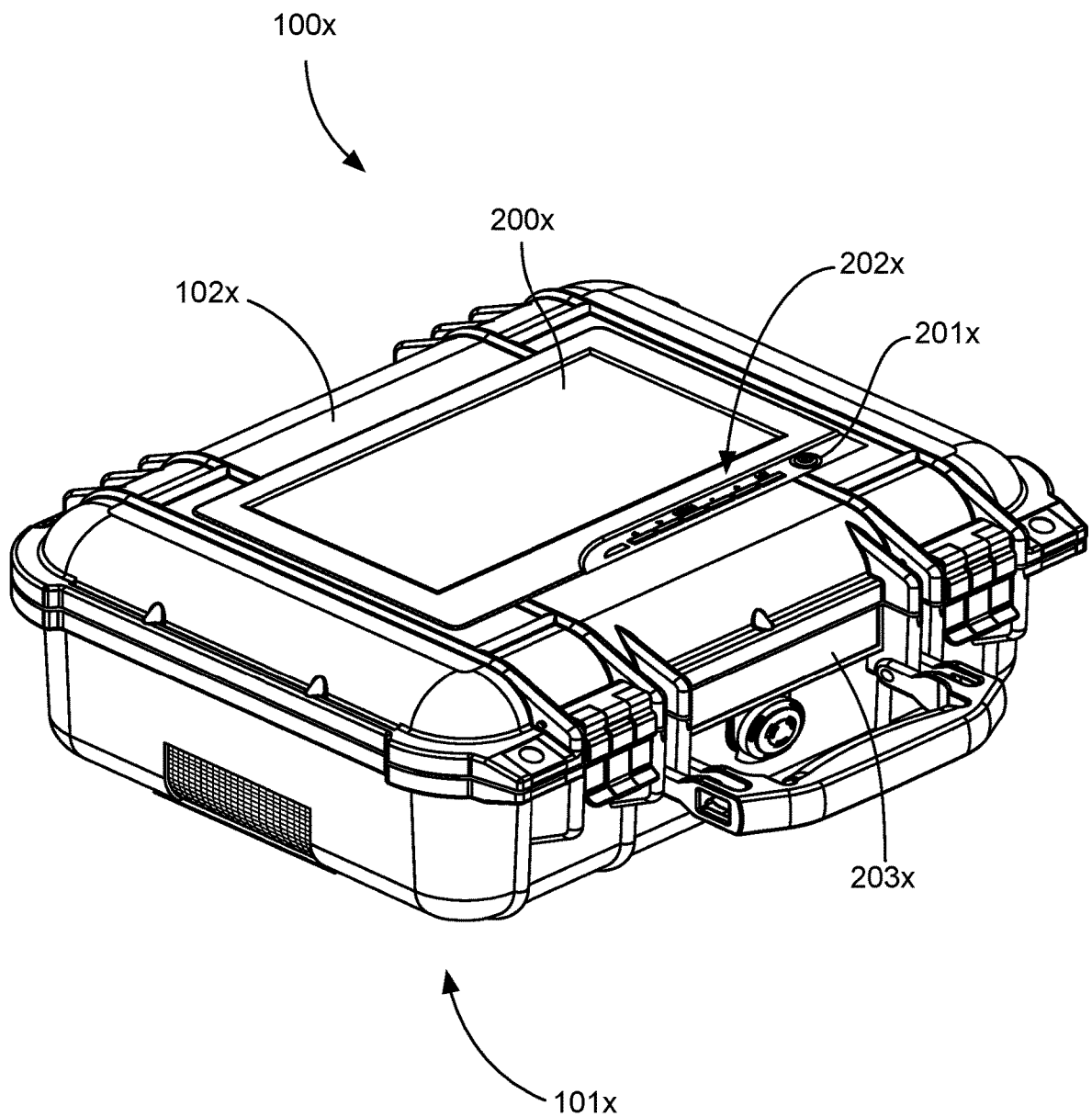
FIG. 5 illustrates a front-left perspective view of an alternative embodiment of the present invention.

FIG. 5 illustrates front-left perspective view of an alternative embodiment of the present invention, specifically where display 200x is positioned within lid 102x of portable device 100x. The embodiment of portable device 100x shown in FIG. 5 is a tamper-proof version of the present invention, that is, lid 102x is locked closed to main body 101x and arranged such that only the manufacturer may open lid 102x to access the internal components. Display 200x is preferably a touchscreen and may also have a plurality of physical display buttons 202x that may facilitate a user in navigating the operating system of portable device 100x. Also located on lid 102x in the alternative embodiment is power button 201x—allowing start-up by a user without needing to open lid 102x and access the internal components (shown and described in view of FIG. 6, infra) within portable device 100x. The alternative embodiment of portable device 100x may also include secondary display 203x. Secondary display is preferably arranged perpendicularly in relation to display 200x and on the side surface of lid 102x. Secondary display 203x may be arranged to display status updates to replace indicator lights or may display programmable communications received from the off-site cloud network. Display 200x may also comprise a plurality of inputs and outputs, e.g., USB, coaxial, HDMI, display port, to allow for a plurality of components to connect to display, e.g., external keyboard, external mouse, external hard drive, etc.

FIG. 6 illustrates a front perspective view of the present invention in an open configuration with display panel 210x opened, illustrating the essential operating components. The components are either located on the back surface of display panel 210x or within internal cavity 119x of main body 101x. When display panel 210x is secured to main body 101x (as shown in FIG. 4), the components affixed to the back surface are within internal cavity 119x of main body 101x. Power source input 112x (shown in FIG. 2) is in communication with power button 201x, which may activate portable device 100x once an AC power source is connected to the power source input 112x. In a preferred embodiment, the AC power source is 120 VAC, however it should be appreciated that 240 VAC power sources may be accepted. The AC power source may be a standard line provided at a worksite or may be provided by an external battery. It should be appreciated that an external rechargeable battery could be fixed to the external surface of portable device 100x. Power button 201x, once activated, is arranged to send the 120 VAC current to power supply 503x. Power supply 503x is specifically a rectifier that converts the 120 VAC current to 12 VDC. In a preferred embodiment, power supply 503x is a FX500 80 PLUS Gold 500 W Flex-ATX power supply; Item model No.: sst-fx500-g manufactured by Silverstone and available at: https://www.silverstonetek.com/product.php?pid=935&area=en.

Figure 8:
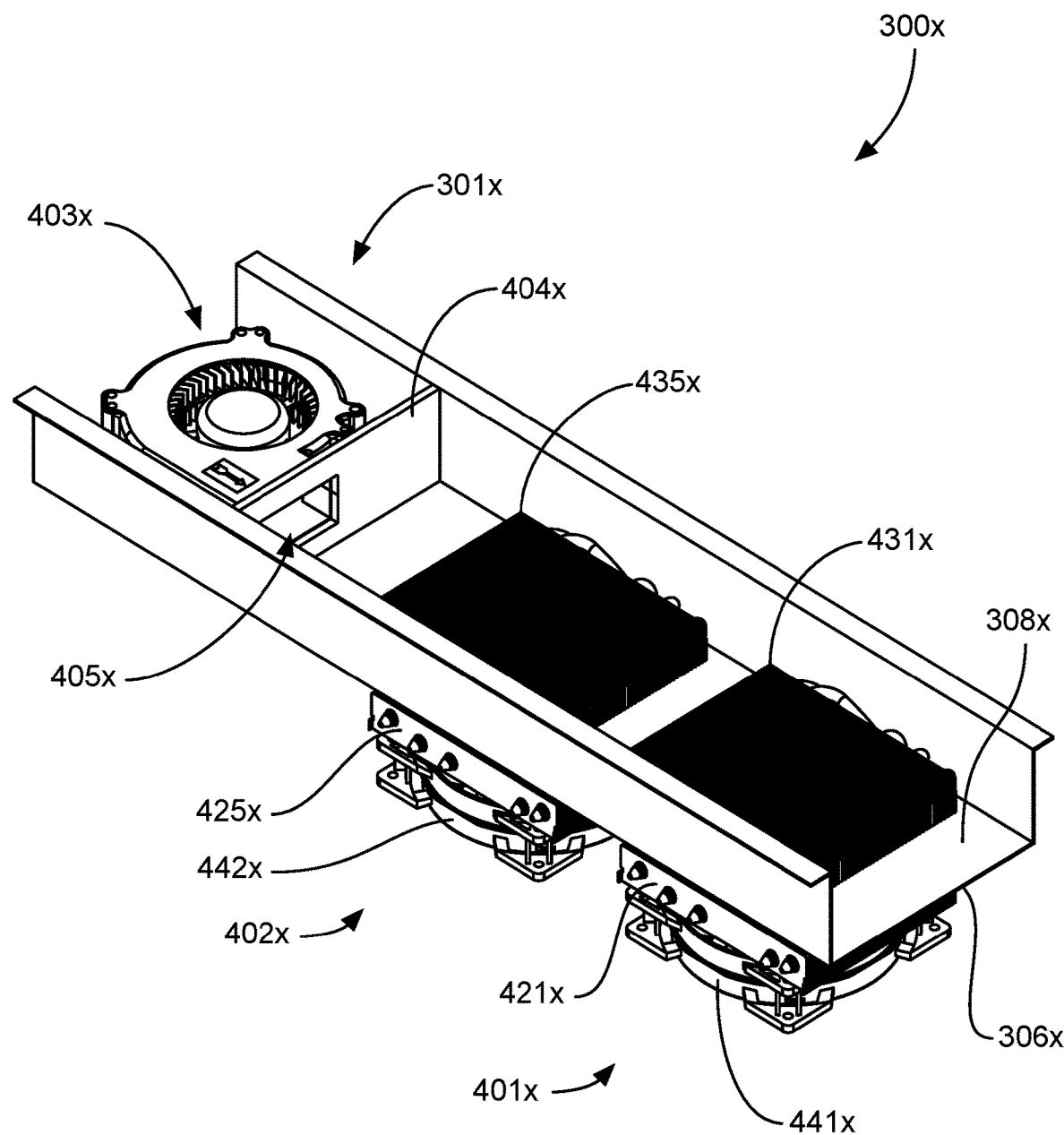
FIG. 8 illustrates a bottom perspective view of heat sink apparatus 300x with outer cover 310x (shown in FIG. 3) removed.

Power supply 503x provides 12 VDC to a plurality of components: step up board 501x, display 200x, computing device 504x, fans 441x and 442x, thermal switch 470x, and blower 403x (shown in FIG. 8). Components connected to computing device 504x are also supplied with 12 VDC.

Upon activation, or power-up, of portable device 100x, power supply 503x is arranged to send the 12 VDC current to step up board 501x. Step up board 501x is a DC current converter apparatus, specifically a converter that steps up the 12 VDC current to 48 VDC. In a preferred embodiment, step up board 501x is a SMAKN Waterproof DC/DC Converter 12V (10-30V) Step UP to 48V/4A 192 W Power Supply Module; Item model No.: B017TPRLLY manufactured by SMAKN. Step up board 501x is preferably arranged to supply 48 VDC to power over ethernet switch 502x (hereinafter "POE switch"). POE switch 502x supplies the 48 VDC to a select quantity of plurality of input/output connectors 111x, such that a select quantity of plurality of input/output connectors 111x are power over internet outputs once computing device 504x is in network communication (internet) with the select quantity of plurality of input/output connectors 111x. In a preferred embodiment POE switch 502x is a Amcrest 5-Port POE+ Power over Ethernet POE Switch with Metal Housing, 4-Ports POE+802.3at 65 w; UPC No.: 853942007756, SKU No.: AMPS5E4P-AT-65 manufactured by Amcrest available at: https://amcrest.com/amcrest-5-port-poe-power-over-ethernet-poe-switch-with-metal-housing-4-ports-poe-802-3at-65w-amps5e4p-at-65.html. It should be appreciated that POE switch 502x may comprise a plurality of POE ports to accommodate a preferred quantity of input/output connectors 111x arranged for POE.

It should be appreciated that power supply 503x may also be arranged to bypass POE switch 502x, such that a select quantity of plurality of input/output connectors 111x may be arranged to be 12 VDC power outputs.

Computing device 504x receives 12 VDC from power supply 503x to power its functionality. Computing device 504x in a preferred embodiment is an Intel® Z590 (LGA 1200) ATX motherboard with PCIe® 4.0; Item model No.: Z590-A LGA 1200 manufactured by ASUS®. Computing device 504x includes a plurality of inputs and outputs, such as three M.2 slots, 16 DrMOS power stages, HDMI®, DisplayPort™, SATA 6 Gbps, Intel® 2.5 Gb Ethernet, USB 3.2 Gen 2x2 Type-C®, front panel USB 3.2 Gen 1 Type-C®, Thunderbolt™ 4 support, and Aura Sync RGB lighting to support functionality of portable device 100x. It should be appreciated the inputs and outputs are merely exemplary and may be readily expanded to configure computing device 504x to handle a plurality of additional components. It should also be appreciated that computing device 504x may receive commands from cloud network 900x (shown in FIG. 11) via a wireless signal communication provided to Wi-Fi radio 507x, a POE connection at plurality of inputs/outputs 111x, or via cellular signal provided by modem 505x such that computing device 504x will communicate the selected function to the appropriate components to initiate a selected communication configuration, discussed further infra.

Computing device 504x is in powered communication (12 VDC) with modem 505x. Modem 505x provides either 4G, LTE, or 5G cellular connection to computing device 504x— enabling computing device 504x to having access to an internet connection and cellular connection, thereby connecting portable device 100x to the offsite cloud network. Modem 505x in a preferred embodiment is a Verizon® UML295 4G LTE USB Modem (Verizon Wireless); ASIN No.: B00E9W8F7U, Item Model No.: UML295 USB Modem manufactured by Verizon®. It should be noted that modem 505x connects to computing device 504x via USB, or alternatives, and may be readily switched to another model capable of providing 5G connectivity.

Computing device 504x is in data communication with display 200x that provides a similar interface to the cloud network, whereas display 200x is arranged to control the various components of portable device 200x, i.e., commands are inputted on display 200x that are received by computing device 504x which communicates the commands to specific components as directed by the coding protocol, e.g., a user inputs a "cooling command" on display 200x which is communicated by computing device 504x to thermal switch 470x to activate blower 403x (shown in FIG. 8 and discussed further, infra).

Computing device 504x is data communication and power communication with transceiver 506x. Transceiver 506x in a preferred embodiment is a NESDR RTL-SDR Receiver, specifically a Nooelec NESDR Mini SDR & DVB-T USB Stick (RTL2832+R820T) with Antenna; SKU No.: 100556, manufactured by Nooelec available at: https://www.nooelec.com/store/sdr/sdr-receivers/nesdr/nesdr-mini.html. Transceiver 506x has a frequency capability of approximately 25 MHz-1750 MHz, and in a preferred embodiment utilizes a 345 MHz frequency.

Computing device 504x is data communication and power communication with Wi-Fi radio 507x. Wi-Fi radio 507x in a preferred embodiment is a Fenvi® FV-AX3000 WiFi 6 PCI-E 3000 Mbps Bluetooth 5.1 Wifi Adapter Intel AX200 Wi-fi Card Wireless PCI Express 802.11ax/ac 2.4 Ghz/5.0 Ghz Dual Band MU-MIMO OFDMA With Heat Sink; Item No.: 9SIADXZAWG3073 manufactured by Fenvi® available at: https://www.newegg.com/fenvi-fv-ax3000-pci-express/p/OXM-00JK-00075. Wi-Fi radio 507x may also comprise any alternative comparable Wi-Fi enabling devices affording both 2.4 Ghz/5.0 Ghz frequencies. Wi-Fi radio 507x provides a Wi-Fi and internet-enabled wireless network for the area surrounding portable device 100x—affording internet network connections for devices and personal devices, e.g., phones or tablets, or other smart personal computing devices, i.e., a Wide Area Network (WAN). Wi-Fi radio 507x may also provide a Local Area Network (LAN) that may be restricted to internet access and may also allow connection of devices within a desired proximity to portable device 100x.

Computing device 504x is configured to include storage 508x, that is, a hard drive arranged to store a plurality of data from computing device 504x, the other electronic components, information from the cloud network, or inputted information from the cloud network or display 200x. In a preferred embodiment, storage 508x is a Samsung® 980 PCIe®3.0 NVMe®SSD 1 TB; Item No.: MZ-V8V1T0B/AM manufactured by Samsung® available at: https://www.samsung.com/us/computing/memory-storage/solidstate-drives/980-pcie-3-0-nvme-gaming-ssd-1tb-mz-v8v1t0b-am/. Storage 508x is arranged to provide 1 TB of memory for computing device 504x, however it should be appreciated that alternatively greater than 1 TB memory devices may be contemplated depending on the needs of a particular worksite.

To afford the plurality of automatic functionality of portable device 100x, described infra, computing device 504x is in communication with logic board 509x. In a preferred embodiment logic board 509x is a SainSmart USB Eight Channel Relay Board for Automation—12V; Item No.: 8541582310, Part No.: 11601 manufactured by SainSmart available at: https://www.amazon.com/SainSmart-Eight-Channel-Relay-Automation/dp/B0093Y89DE. Logic board 509x is powered by the 12 VDC from computing device 504x. Logic board 509x is in communication with plurality of indicator lights 110x, siren 115x, and thermal switch 470x—providing automated functionality per the code protocol of portable device 100x.

Siren 115x is arranged to provide audio alarms in correspondence with alerts and inputs communicated from logic board 109x, discussed further infra. In a preferred embodiment, siren 115x is a 22 mm 12V AC/DC LED Flashing Buzzer Pilot Panel Indicator Light (Red); Part No.: PL22-BZ-12 manufactured by Alpinetech available at: https://www.amazon.com/Flashing-Buzzer-Pilot-Panel-Indicator/dp/B078JC6RPX. Siren 115x may provide visual, audio, or visual and audio alerts, depending on the communications provided from logic board 109x and the coding protocol.

Thermal switch 470x is in data communication with logic board 509x and in direct power connection with power supply 503x. In a preferred embodiment thermal switch 470x is a UMLIFE 2PCS Temperature Controller Module with Case; Part No.: W1209, UNSPSC Code: 43000000 manufactured by UMLIFE available at: https://www.amazon.com/Temperature-Controller-Display-Thermostat-Waterproof/dp/B07H2X4NNR/ref=asc_df_B07H2X4NNR/?tag=&linkCode=df0&hvadid=4167 99911477&hvpos=&hvnetw=g&hvrand=7826671351025864556&hvpone=&hyptwo=&hvqmt=&hvdev=c&hvdvcmdl=&hvlocint=&hvlocphy=9005550&hvtargid=pla-827121042231&ref=&adgrpid=93604212173&th=1. Thermal switch 470x is arranged to activate heat sink apparatus 300x and may do so by sensing a programmed internal temperature of portable device 100x, from a command received from computing device 504x that is relayed to logic board 509x then to thermal switch 470x, or from a programmed timer that is communicated from computing device 504x to logic board 509x then to thermal switch 470x FIG. 6 also shows seal 130x. Seal 130x is a weatherproof and water seal that is arranged to seal sidewall 305x of heat sink apparatus 300x to the outer edge of heat sink channel 120x (shown in FIG. 3). It should be noted that a second seal is provided for the outer edge of heat sink channel 120x and sidewall 304x—located opposite of sidewall 305x.

Fans 441x and 442x, and heat sink apparatus 300x are discussed herein in view of FIGS. 7-10.

Figure 7:
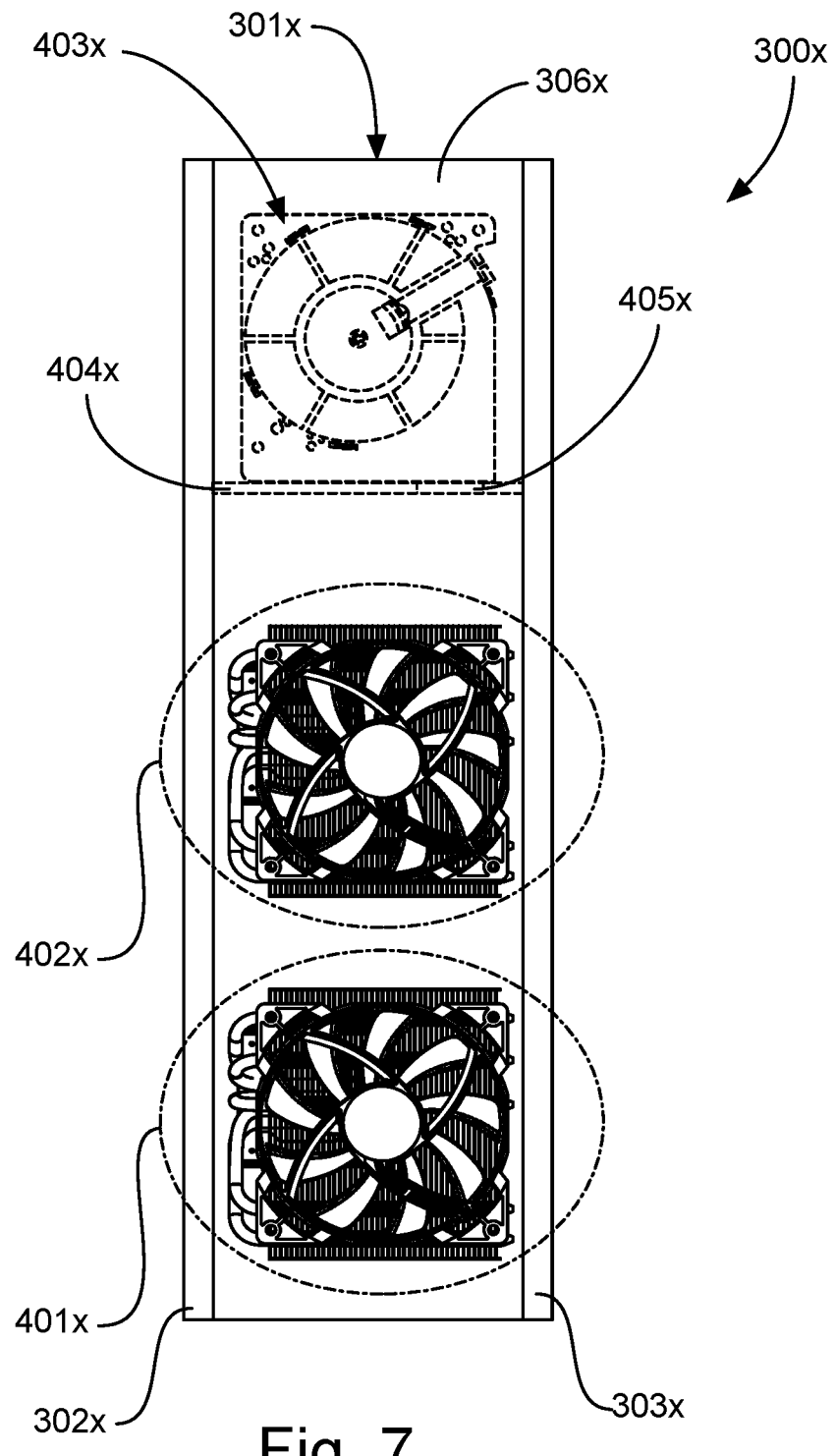
FIG. 7 illustrates a top view of heat sink apparatus 300x.
Figure 9:
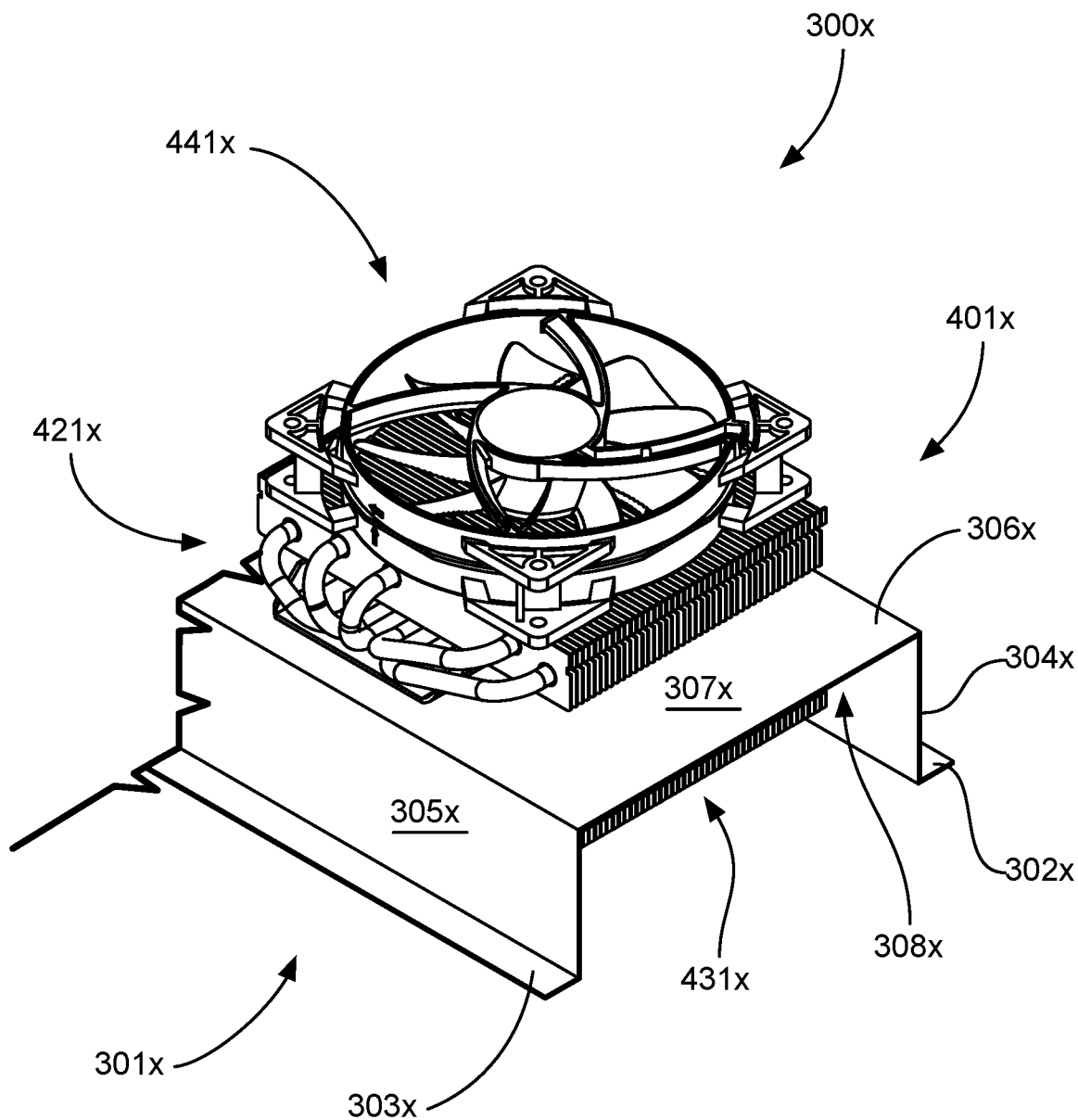
FIG. 9 illustrates a partial view of heat sink apparatus 300x, specifically showing heat management apparatus 401x.
Figure 10:
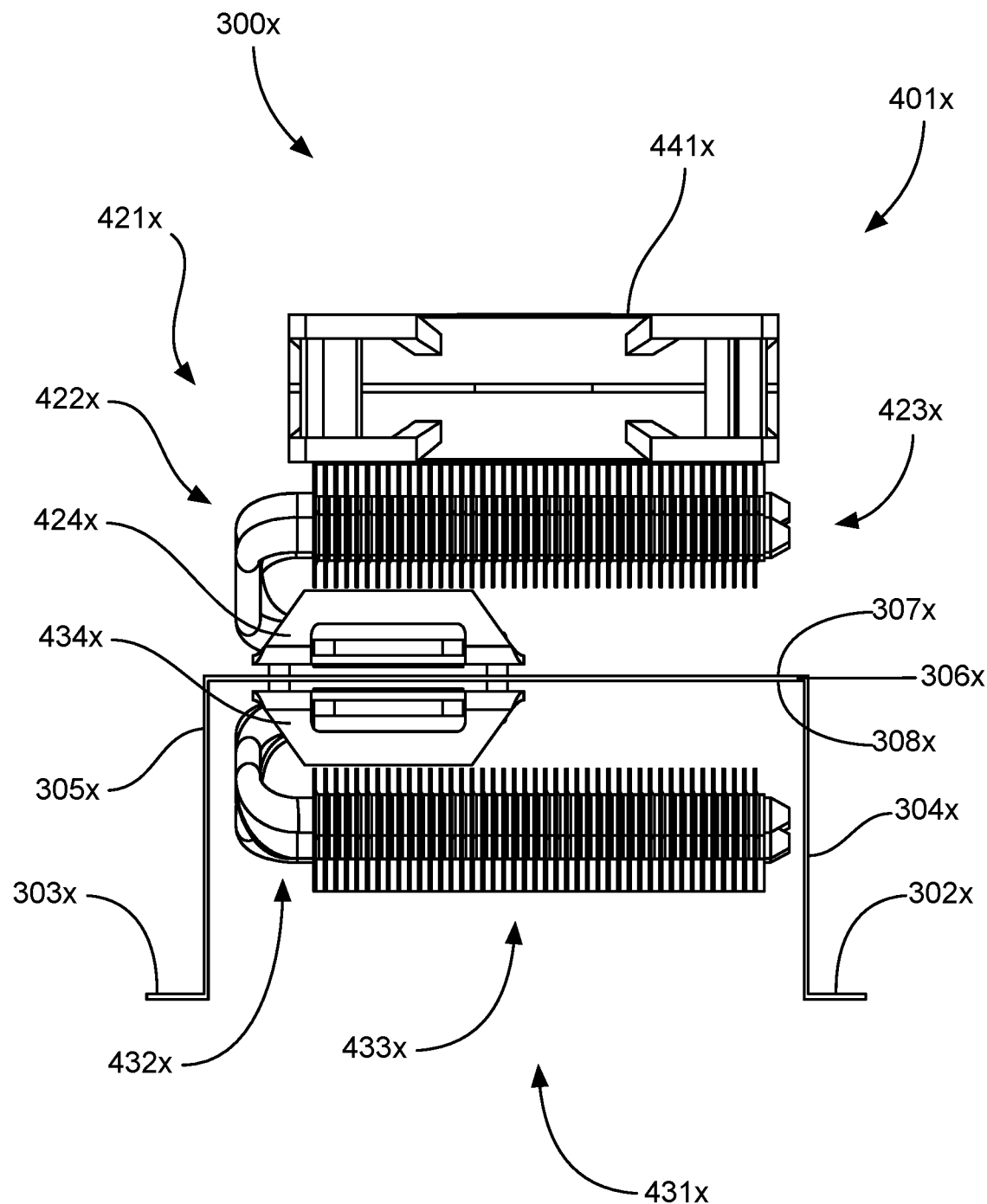
FIG. 10 illustrates a right side view of heat sink apparatus 300x.

The following description should be taken in view of FIGS. 7-10. FIG. 7 illustrates a top view of heat sink apparatus 300x removed from portable device 100x. FIG. 8 illustrates a bottom perspective view of heat sink apparatus 300x with cover 310x removed. FIG. 9 illustrates a partial view of heat sink apparatus 300x, specifically showing heat management apparatus 401x. FIG. 10 illustrates a right side view of heat sink apparatus 300x. As discussed supra, heat sink apparatus 300x generally comprises U-shaped channel 301x, at least one heat management apparatus (401x and 402x), blower 403x, and partition 404x. Heat management apparatuses 401x and 402x sandwich mounting plate 306x, whereas an internal portion of heat management apparatuses 401x and 402x is mounted on internal surface 307x of U-shaped channel 301x, specifically mounting plate 306x, and an external portion of heat management apparatuses 401x and 402x is mounting on external surface 308x of U-shaped channel 301x, specifically mounting plate 306x. Blower 403x is mounting on external surface 308x of U-shaped channel 301x, specifically mounting plate 306x. Blower 403x is preferably arranged proximate to a first end of U-shaped channel 301x, specifically blower 403x is arranged at an opposite end of U-shaped channel 301x in relation to heat management apparatuses 401x and 402x, where heat management apparatus 402x is located proximate to a substantially central location of U-shaped channel 301x, as shown in FIG. 7. Blower 403x is arranged to blow air through aperture 405x of partition 404x, whereas partition 404x creates a bifurcation between blower 403x and heat management apparatuses 401x and 402x. Partition 404x prevents substantial airflow between its respective side within U-shaped channel 301x, such that only forced air from blower 403x may be passed through aperture 405x in the direction towards heat management apparatuses 401x and 402x. Blower 403x is arranged to intake ambient air from outside of U-shaped channel 301x and force the air through U-shaped channel 301x where the air travels through the portions of heat management apparatuses 401x and 402x that are mounting on external surface 308x of U-shaped channel 301x.

The following description of heat management apparatus 401x also pertains to heat management apparatus 402x and is best shown in FIGS. 9 and 10. Heat management apparatus 401x includes heat pipe radiator 421x comprising mounting plate 424x, a plurality of heat pipes 422x extending from mounting plate 424x and intersecting through the entirety of heatsink 423x, and fan 441x mounted on the top of heatsink 423x. Heat management apparatus 401x also includes heat pipe radiator 431x comprising mounting plate 434x, a plurality of heat pipes 432x extending from mounting plate 434x and intersecting through the entirety of heatsink 433x. To complete heat management apparatus 401x, a pair of heat pipe radiators (421x and 431x) are used. Internal heat pipe radiator 421x and external heat pipe radiator 431x are arranged to sandwich mounting plate 306x of U-channel 301x. Mounting plate 424x of internal heat pipe radiator 421x is fixedly secured to internal surface 307x of mounting plate 306x of U-channel 301x, and mounting plate 434x of external heat pipe radiator 431x is fixedly secured to external surface 308x of mounting plate 306x of U-channel 301x. It should be appreciated that all of the components arranged on internal surface 307x of U-channel 301x are within the internal cavity of portable device 100x, except shelves 302x and 303x, which are arranged to fixedly and sealably secure to bottom surface 113x of portable device 100x. External surface 308x of shelves 302x and 303x face the outside environment of portable device 100x and arranged to accept cover 310x (shown in FIG. 3) thereon via screws, live hinges, or other acceptable means that allow cover 310x to be removed for cleaning or performing maintenance on heat sink apparatus 300x.

In sum, heat management apparatus 402x comprises: heat pipe radiator 425x having fan 442x, heatsink 427x, plurality of heat pipes 426x, and mounting plate 428x; and, heat pipe radiator 435x having, heatsink 437x, plurality of heat pipes 436x, and mounting plate 438x.

It should be appreciated that heat pipes refer to a heat-transfer device that employs phase transition to transfer heat between two solid interfaces. It should also be appreciated that the quantity of heat pipes illustrated in FIGS. 7-10 is merely exemplary, and in a preferred embodiment, the preferred ratio of internal heat pipes (422x and 426x) to external heats pipes (432x and 436x) is 5 to 7, respectively, for heat management apparatuses 401x and 402x. Internal heat pipes (422x and 426x) and external heats pipes (432x and 436x) provide an optimum space-conscious solution to overheating within portable device 100x, whereas activation of blower 403x only increases the temperature regulation by introducing ambient air into U-channel 301x of portable device 100x without compromising the sealed nature of internal cavity 119x of portable device 100x.

In operation the fans (441x and 442x) of heat management apparatuses 401x and 402x are arranged to run constantly upon powering up portable device 100x. Blower 403x (shown in FIG. 7) is in communication with the thermal switch, logic board, and the onboard CPU. Blower 403x may be activated by a temperature trigger initiated from the thermal switch, that is, thermal switch is programmed to turn on blower 403x at a detectable and programmable internal temperature threshold of portable device 100x. Blower 403x may also be activated from the logic board and the onboard commuting device, either from activating the blower from the touch display, or a signal that is communicated from the cloud network to the computing device to the logic board. In an event that blower 403x is activated from the cloud network communication, this activation may not be overridden by manual deactivations from the touch display—to ensure portable device 100x remains at an optimal operating temperature.

The temperature management data of heat sink apparatus 300x of portable device 100x, whereas ambient temperatures are provided in Fahrenheit and references the temperature outside of portable device 100x and internal temperatures are provided in Fahrenheit and references the temperature inside of portable device 100x, whereas system status refers to blower 403x, fan 441x and fan 442x all in operation, provided below:

| System Status | Day | Ambient | Internal | Weather |
|---|---|---|---|---|
| 100% Load | 1 | 81 | 91 | Full Sun |
| 100% Load | 2 | 80 | 99 | Full Sun |
| 100% Load | 3 | 84 | 102 | Full Sun |
| 100% Load | 4 | 82 | 104 | Full Sun |
| 100% Load | 5 | 83 | 102 | Full Sun |
| 100% Load | 6 | 82 | 102 | Full Sun |
| 100% Load | 7 | 81 | 99 | Cloudy |
| 100% Load | 8 | 80 | 100 | Full Sun |
| 100% Load | 9 | 80 | 101 | Full Sun |
| 100% Load | 10 | 81 | 100 | Full Sun |
| 100% Load | 11 | 78 | 97 | Setting Sun |
| 100% Load | 12 | 76 | 97 | Setting Sun |
| 100% Load | 13 | 72 | 92 | Setting Sun |

Figure 11:
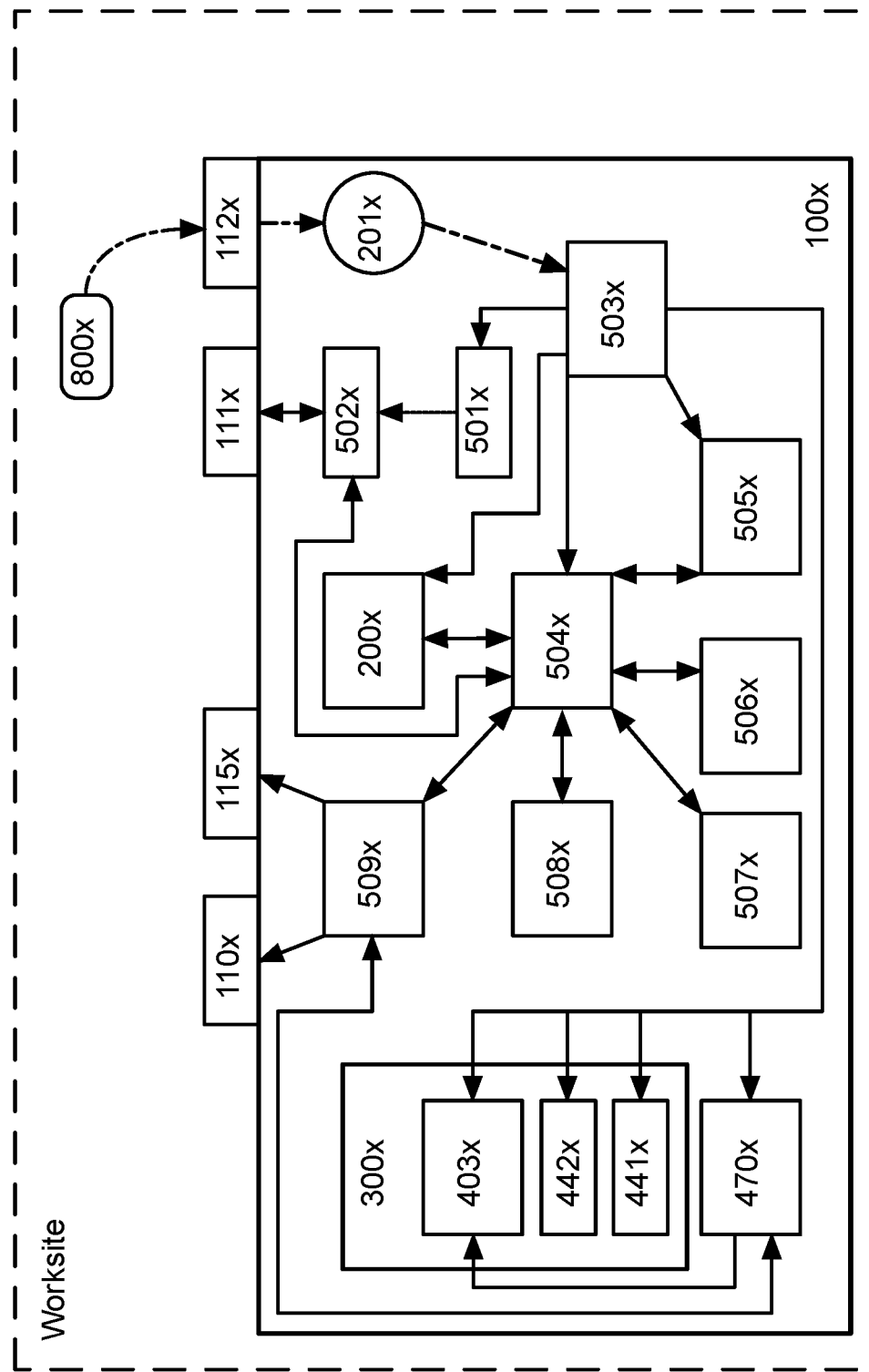
FIG. 11 illustrates a high level schematic of the components of the present invention.

FIG. 11 illustrates a high-level schematic of the electronic connections of portable device 100x, including electric current and data communication connections. It should be appreciated that FIG. 11 includes broken lines, whereas the long-short-long dashed broken lines indicate an electrical current carrying 120 VAC or 240 VAC, the short-short dashed broken lines indicate an electrical current carrying 48 VDC, and solid lines indicate an electrical current carrying 10 VDC and/or data communications, as specified in the following description.

Portable device 100x is powered by 120 VAC 800x (or 240 VAC). 120 VAC 800x is connected to portable device 100x via power supply input 112x. The 120 VAC current from power supply input 112x is sent to power supply 503x upon activation of power button 201x. Power supply 503x receives the 120 VAC current and converts the electrical current from 120 VAC to 12 VDC. The 12 VDC current is sent from power supply 503x to step up board 501x which steps the 12 VDC current up to 48 VDC. The 48 VDC current is sent to power over ethernet switch 502x. Power supply 503x also sends the 12 VDC current to computing device 504x, display 200x, modem 505x, thermal switch 470, fans 441x and 442x and blower 403x of heat sink apparatus.

Computing device 504x includes a plurality of connectors capable of outputting the 12 VDC current while also providing data communication. Computing device 504x provides data communication to power over ethernet switch 502x. Power over ethernet (PoE) switch provides data communication and 48 VDC to a power over ethernet connector that may be one of the plurality of input/output connectors 111x. Computing device 504x also provides data communication to display 200x, where the data communication provided to display 200x may include data from transceiver 506x, Wi-Fi radio 507x, storage 508x, and logic board 509x—all of which are powered by 12 VDC via computing device 504x. Modem 505x and Wi-Fi radio 507x provides wide area network (WAN) communication capabilities such that computing device 504x is internet-connected. The WAN provided by modem 505x and Wi-Fi radio 507x connect computing device 504x to cloud network 900x. Cloud network 900x is essentially another computing device 504x that has the capability of communicating commands to computing device 504x which in turn will communicate those commands to a plurality of components to execute a desired communication configuration. It should also be appreciated that modem 505x may not be necessary to establish a WAN, as certain worksites may already have an internet accessible WAN that portable device 100x may access via Wi-Fi radio 507x. Further, a WAN may alternatively be established via an internet accessible PoE connection through a PoE connector provided by plurality of input/output connectors 111x which may then be wirelessly broadcasted to the worksite via Wi-Fi radio 507x. In some cases, a WAN may not be needed for a particular worksite such that only a local area network (LAN) is needed. Cloud network 900x may communicate this configuration over a POE connection to computing device 504x to instruct Wi-Fi radio 507x to not establish a WAN.

Power supply 503x provides 12 VDC to thermal switch 470x, fans 441x and 442x of heat sink apparatus 300x, and blower 403x of heat sink apparatus 300x. As discussed supra, fans 441x and 442x are arranged to constantly run to circulate the internal air within portable device 100x through internal heat pipes (422x and 426x) and external heats pipes (432x and 436x), as described supra. Blower 403x is in communication with thermal switch 470x and logic board 509x. Blower 403x may be activated in two different ways, either upon communicative direction from logic board 470x or by a direct activation from thermal switch 470x upon thermal switch 470x detecting a pre-programmed internal temperature within internal cavity 119x of portable device 100x. When blower 403x is activated via logic board 509x, the communication may be prompted by an input of display 200x that initiates computing device 504x to send the command to logic board 509x. Alternatively, Wi-Fi radio 507x may receive an input command from the offsite cloud that is communicated to computing device 504x and is then communicated to logic board 509x.

Logic board 509x is programmed to activate a plurality of components in response to variety of input communications. Generally, logic broad 509x is programmed to initiate plurality of indicators lights 110x, siren 115x, thermal switch 470x in response to a variety of detectable variables, discussed in further detail infra. While logic broad 509x initiates the abovementioned components, computing device 504x communicates these indicators to display 200x for visual recognition on the worksite while also communicates these indicators to cloud network 900x for offsite recognition of the indicators via the WAN.

Figure 12:
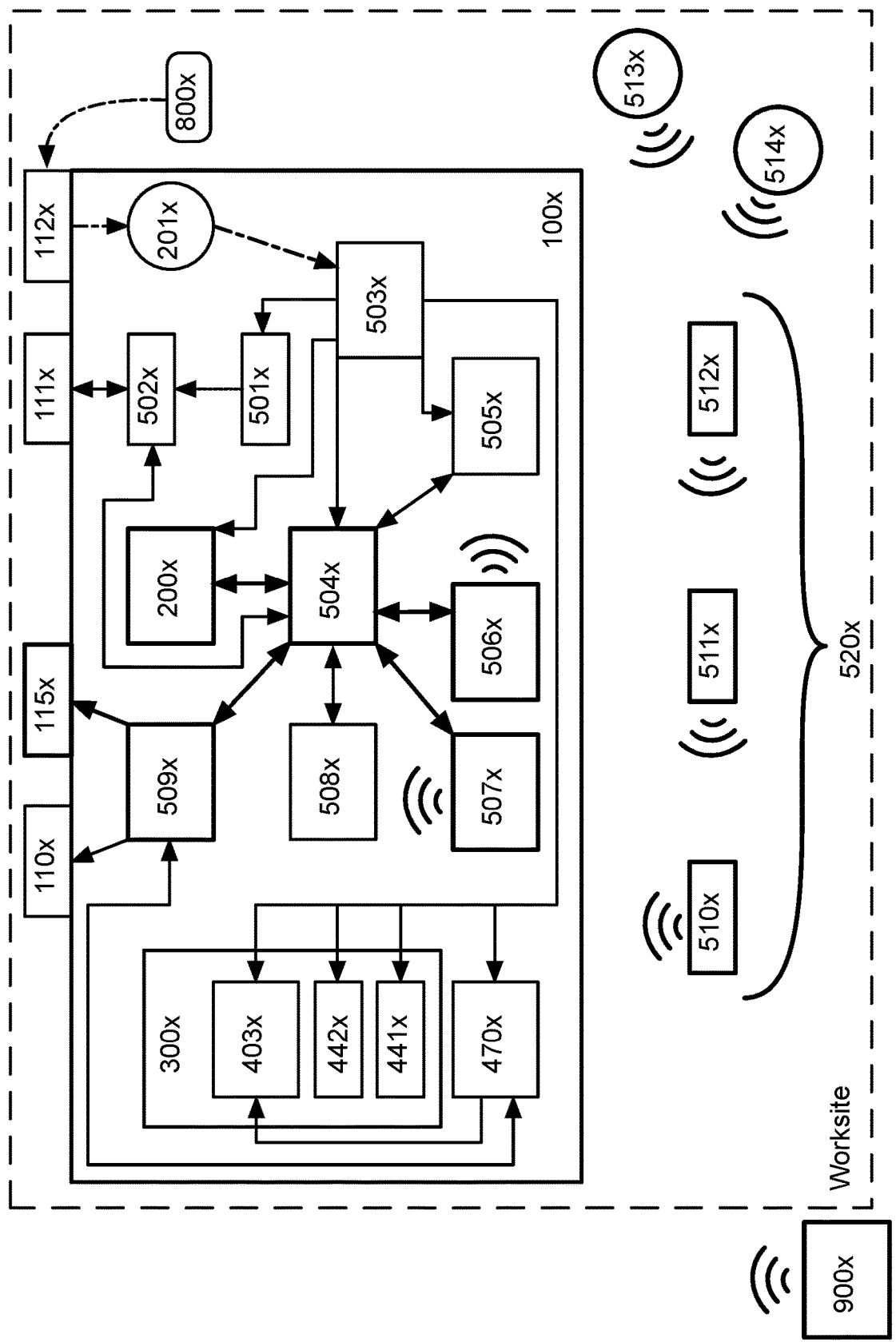
FIG. 12 illustrates a high-level schematic of one of the communication configurations of the present invention.

FIG. 12 illustrates a high-level schematic of one of the communication configurations of portable device 100x and cloud network 900x. FIG. 12 specifically illustrates the environmental detection communication configuration, and the essential components of the environmental detection communication configuration are illustrated having heavier-weighted lines (i.e., darker) for clarity. It should be appreciated that FIG. 12 is merely exemplary and is nonrestrictive, as alternative methods of executing the environmental detection communication configuration may be contemplated by the aforementioned components of portable device 100x and cloud network 900x.

To setup the environmental detection communication configuration, external transceiver cascade 520x is arranged at various locations around a worksite. External transceiver cascade 520x is shown to comprise external transceivers 510x-512x, whereas external transceivers 510x-512x are radio transceivers arranged to communicate with radio transceiver 506x. Alarms 513x and 514x may comprise motion detectors, water/moisture detectors, glass break detectors, sound sensors, heat sensors, smoke alarms, $CO_2$ and/or gas detectors, and/or remote or personal panic sensors. Alarms 513x and 514x are preferably arranged to communicate via radio frequency to any one of external transceiver 510x-512x of external transceiver cascade 520x. For example, alarm 513x may detect an environmental event that triggers a radio frequency signal to be sent to the closest of external transceivers 510x-512x, e.g., 512x, which will receive and forward the signal to the next closest external transceiver, e.g., 511x, to the next closest external transceiver, e.g., 510x, to send the signal to radio transceiver 506x that communicates the signal to computing device 504x. Computing device 504x will process the signal from radio transceiver 506x and indicate that it was received on display 200x. Computing device 504x will also send the received signal to logic board 509x which will programmably activate siren 115x, or alternatively, one of plurality of indicator lights 110x depending on the particle signal and the programming protocol. Lastly, computing device 504x will send the received signal over the WAN via Wi-Fi radio 507x to cloud network 900x so that the signal is also received offsite.

Figure 13:
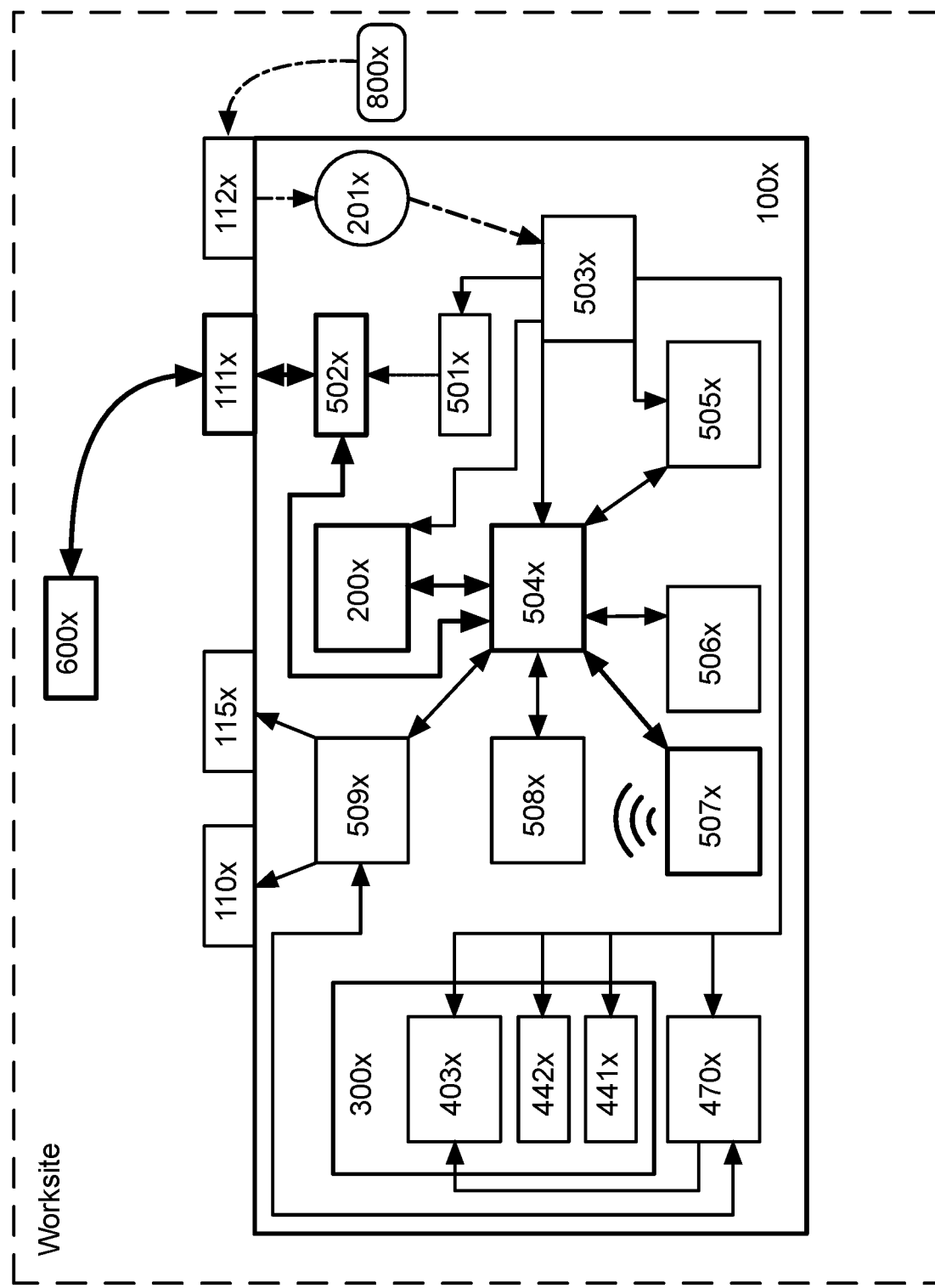
FIG. 13 illustrates a high-level schematic of another communication configuration of the present invention.
Figure 13:
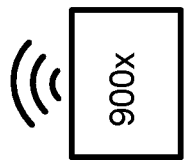

FIG. 13 illustrates a high-level schematic of another one of the communication configurations of portable device 100x and cloud network 900x. FIG. 13 specifically illustrates the monitoring communication configuration, and the essential components of the monitoring communication configuration are illustrated having heavier-weighted lines (i.e., darker) for clarity. It should be appreciated that FIG. 13 is merely exemplary and is nonrestrictive, as alternative methods of executing the monitoring communication configuration may be contemplated by the aforementioned components of portable device 100x and cloud network 900x.

To set up the monitoring communication configuration, at least one monitoring camera 600x is arranged at a specific location on the worksite, e.g., an entrance. Monitoring camera 600x is also explained in greater detail, infra. In a preferred embodiment, monitoring camera 600x is connected to portable device 100x via a POE connector at plurality of inputs/outputs 111x. This connection provides monitoring camera with 48 VDC current to power monitoring camera 600x and also provides an ethernet connection to connect with computing device 504x. Computing device 504x may wirelessly communicate the data from the POE connection to cloud network 900x via the WAN provided by Wi-Fi radio 507x. Monitoring camera 600x is arranged to provide a live feed of its field of view that may be accessed via display 200x or through cloud network 900x. It should be appreciated that multiple monitoring cameras may be connected to portable device 100x and their respective video feeds may be displayed on display 200x and through cloud network 900x.

Figure 14:
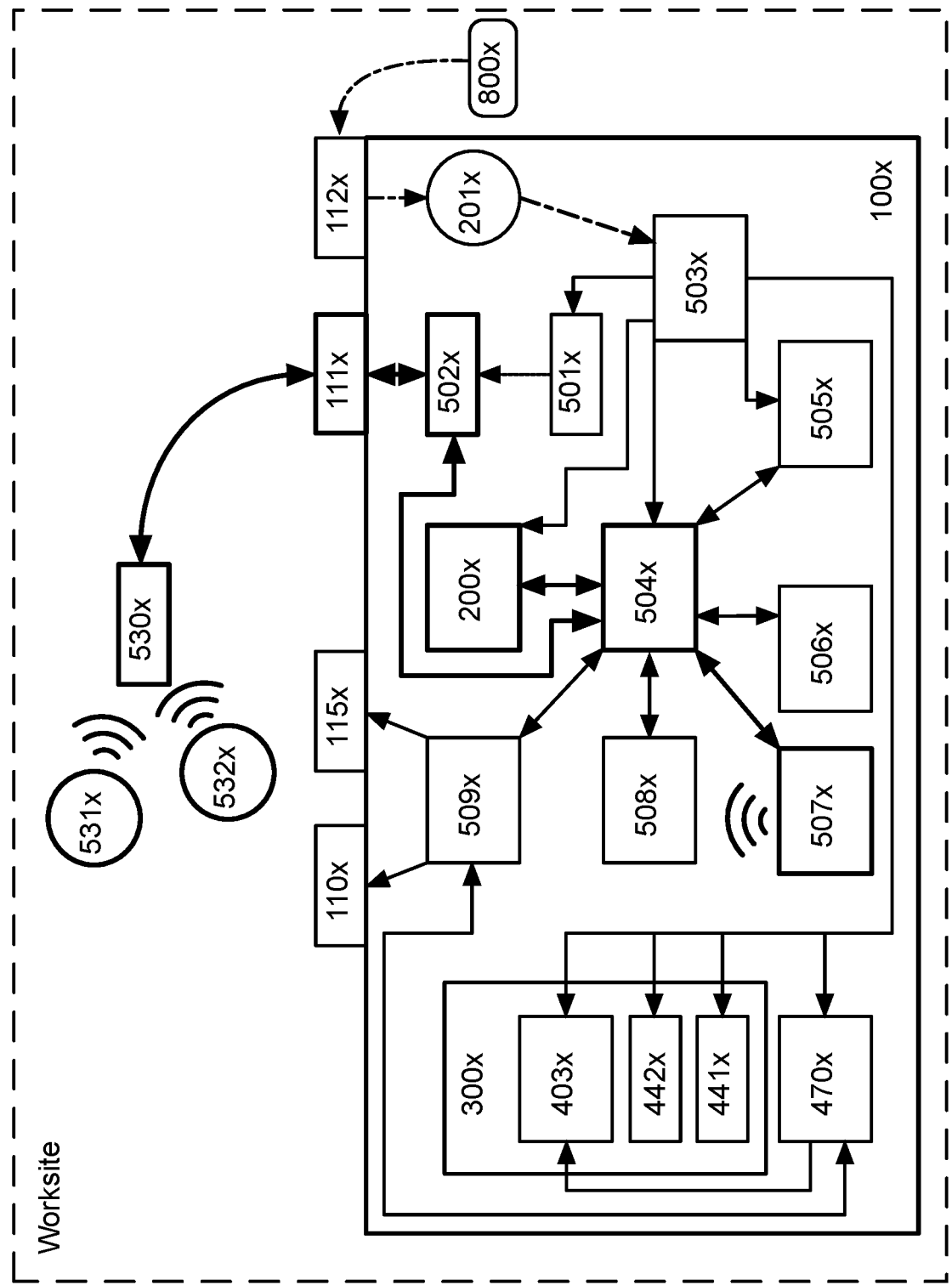
FIG. 14 illustrates a high-level schematic of a further communication configuration of the present invention.

FIG. 14 illustrates a high-level schematic of a further communication configuration of portable device 100x and cloud network 900x. FIG. 14 specifically illustrates the check-in communication configuration, and the essential components of the monitoring communication configuration are illustrated having heavier-weighted lines (i.e., darker) for clarity. It should be appreciated that FIG. 14 is merely exemplary and is nonrestrictive, as alternative methods of executing the check-in communication configuration may be contemplated by the aforementioned components of portable device 100x and cloud network 900x.

To set up the check-in communication configuration, at least one tag scanner 530x is arranged at a specific location on the worksite, e.g., an entrance. As shown in FIG. 14, at least one tag scanner 530x is wiredly connected to at least one of plurality of input/output connectors 111x by either a LAN POE connection or a serial port. Tag scanner 530x in a preferred embodiment is an RFID tag scanner or other comparable proximity scanners. Tag scanner 530x is arranged to scan tags 531x and 532x and communicate the particular information associated with each respective tag back to computing device 504x, whereas computing device 504x communicates that information to display 200x and to Wi-Fi radio 507x to be communicated over the WAN to cloud network 900x for offsite viewing.

In a preferred embodiment, before portable device 100x is deployed on a worksite and tag scanner 530x is connected, cloud network 900x is programmed with a populated list of employees, contractors, tools, etc. that contains various data points concerning that particular item or person. These items or persons are assigned a tag (531x, 532x, etc.) and that particular list is assigned to a specific job site. Cloud network 900x communicates this populated list via the WAN and to computing device 504x, which then allows the list to be viewable on display 200x. When respective tags are scanned, this input is communicated to computing device 504x and then updated on display 200x and cloud network 900x, constantly refreshing the populated list with check-in times, location of check-in if there are a plurality of tag scanners, etc. This check-in communication configuration provides a constantly updated roster of personnel and tools that are present on the worksite that may be offloaded from either computing device 504x or cloud network 900x to produce reports. The reports can be used to show a roster of individuals who were working on the worksite than can then be used to cross-reference licensing, skills, medical history, etc., in the event that this information is needed for accidents to protect construction companies for litigation, alternatively cloud network 900x is further arranged to use the communication protocol to automatically contact emergency service, e.g., 911 call. Additionally, this emergency protocol may be manually inputted via cloud network 900x, or through display 200x of portable device 100x. If a WAN is not available and connectivity to cloud network 900x is respectively not available—computing device 504x may store this information in storage 508x so it is later retrievable. In alternative embodiments, the check-in communication configuration may be programmed to activate siren 115x, an indicator light of plurality of indicator lights 110x, and a notification on display 200x should a respective tag be read by tag scanner 530x, i.e., someone associated with tag 531x was programmed by cloud network 900x to have authorized access to the worksite on a specific date or was unauthorized until a specific licensing requirement was fulfilled. In a preferred embodiment, should an unauthorized tag be scanned at 530x, computing device 504x and/or cloud network 900x will access contact information from the populated list that is associated with the particular tag and either use the WAN or modem 505x to send either an automated telephone call or text message to the contact communicating either instructions, grounds of the unauthorized indication, or other programmed information. This automated response protocol is detailed further in view of FIG. 16, infra.

Although FIG. 14 illustrates tag scanner 530x in a wired connection with 111x, either via LAN POE or serial connection, it should be appreciated that Wi-Fi radio 507x may broadcast a LAN that tag scanner 530x may be configured to wirelessly communicate with over the LAN to communicate the scanner data to computing device 504x.

Figure 15:
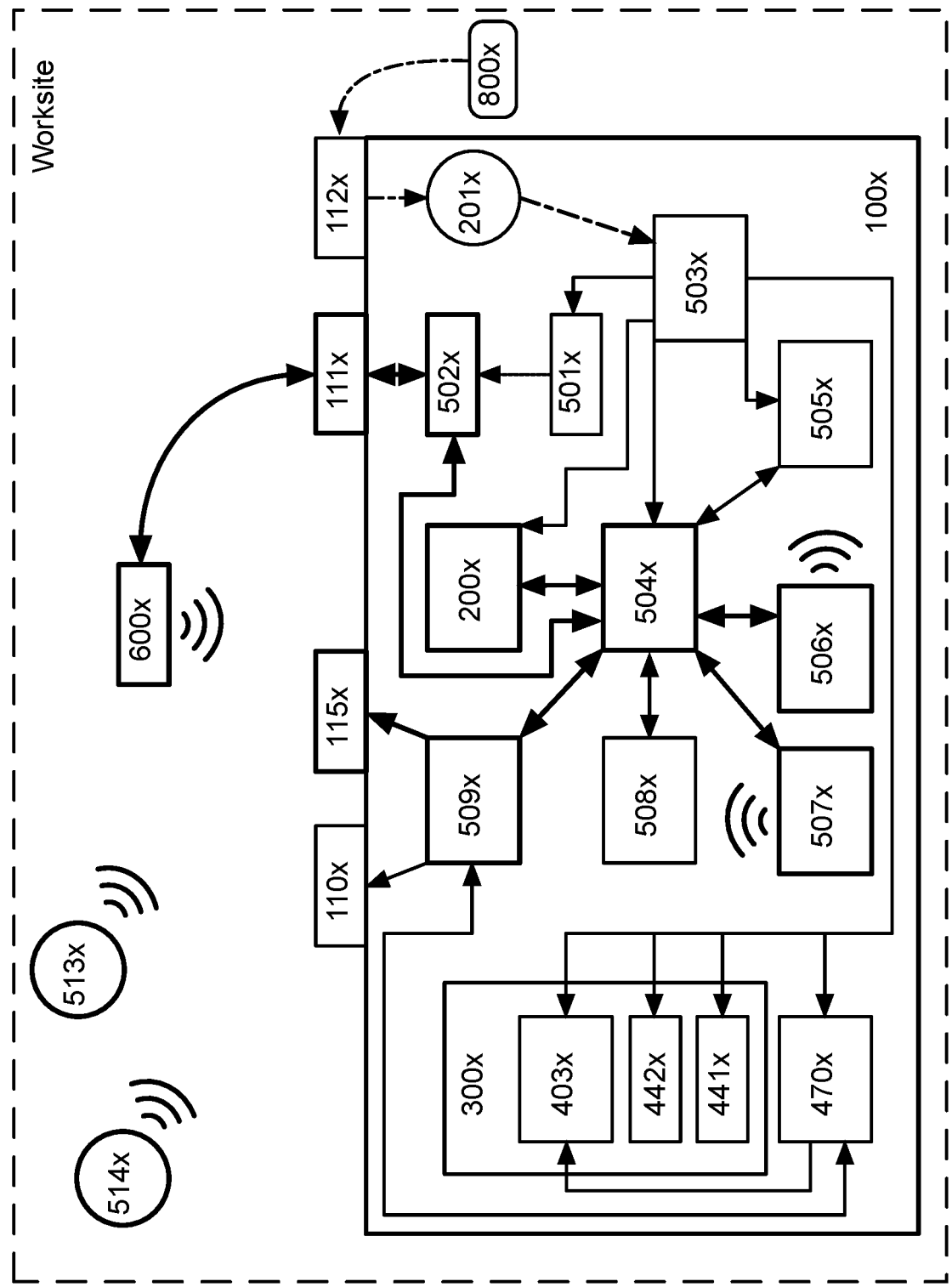
FIG. 15 illustrates a high-level schematic of an alternative embodiment of the communication shown in FIG. 13.

FIG. 15 illustrates a high-level schematic of an alternative embodiment of the environmental detection communication configuration shown in FIG. 12. In an alternative embodiment, monitoring camera 600x includes a transceiver that is in communication with radio transceiver 506x—eliminating the need for the transceiver cascade 520x shown in FIG. 12—to receive the radio signals from alarms 513x and 514x and to communicate those signals to transceiver 506x or over POE connection at 111x, to computing device 504x.

Figure 16:
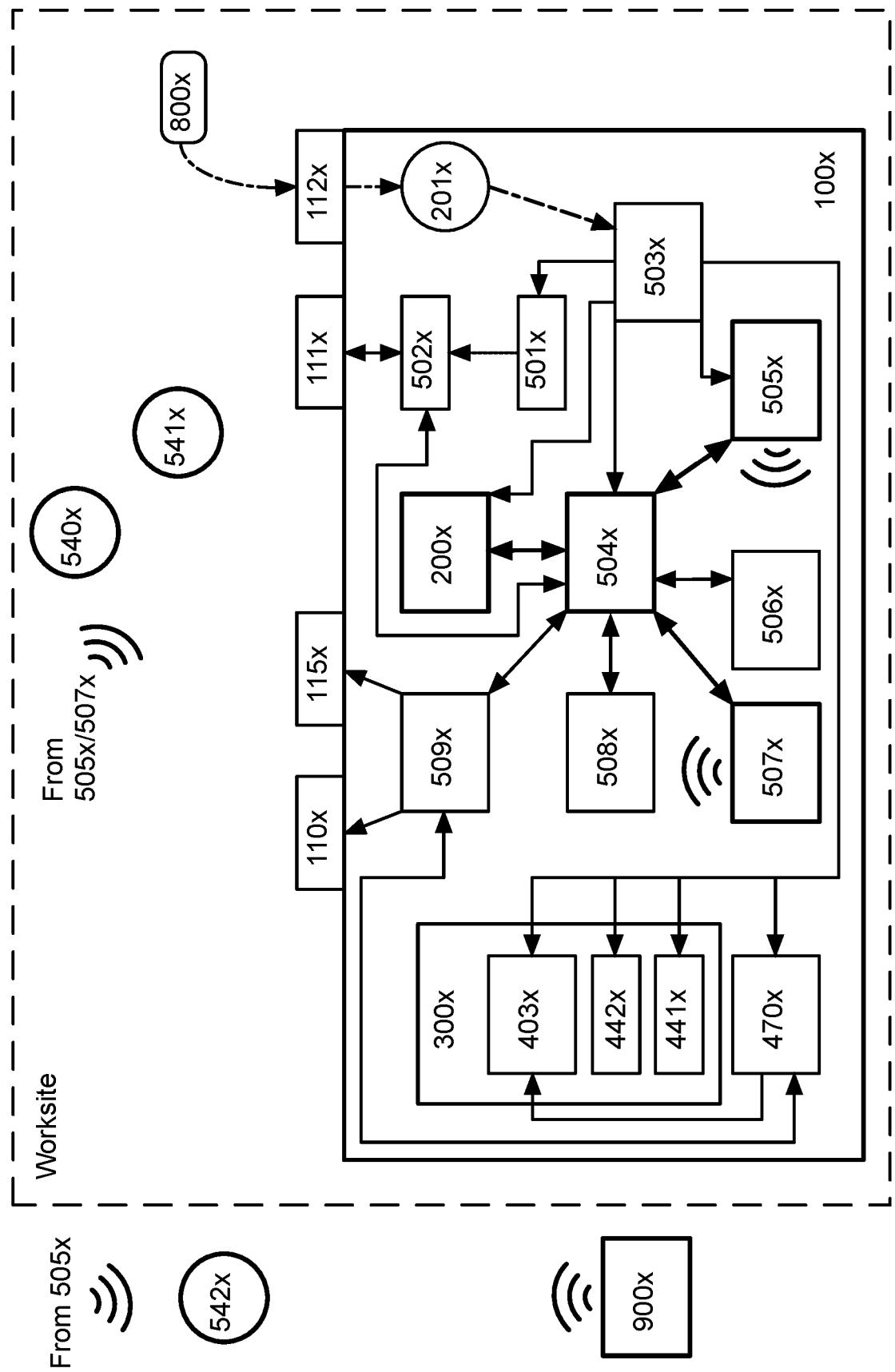
FIG. 16 illustrates a high-level schematic of a still further communication configuration of the present invention.

FIG. 16 is a high-level schematic of the automated response communication configuration of portable device 100x and cloud network 900x. The automated response communication configuration is essentially a communicating protocol that can be activated from either display 200x and computing device 504x or cloud network 900x that will send programmable messages via text message or automated voice message to a group of contacts from a populated list of employees, contractors, etc., or a pre-populated category of contacts. The populated list in a preferred embodiment is uploaded to cloud network and communicated to computing device 504x. The populated list may alternatively be uploaded onto storage 508x of computing device 504x where a WAN is not available. As shown in FIG. 16, cellphones 540x and 541x are located on the worksite and associated with particular employees, while cellphone 542x is located off site and associated with a particular employee. To provide essential communications, emergency notifications, safety protocols, or other pertinent information associated with a worksite, the contact information, e.g., cellphones 540x-542x, are gathered from the populated list. In the event that communications need to be broadcasted to employees, the message is populated at cloud network 900x or through display 200x and then communicated to computing device 504x, where the message is then inputted for broadcasting to all of the selected contacts, e.g., cellphones 540x-542x. For cellphones located within the worksite, the WAN provided by Wi-Fi radio 507x can communicate the broadcast to cellphones 540x and 541x, or alternatively modem 505x can communicate the broadcast via its cellular signal (4G/5G/LTE). For cellphones located offsite or out of reach of the WAN, e.g., cellphone 542x, modem 505x can communicate the broadcast via its cellular signal (4G/5G/LTE).

It should be appreciated that cloud network 900x is preferably an offsite computing device and may have various levels of access. For example, supervising contractors of worksites will have an overarching level of access via cloud network 900x beyond the access of portable device 100x that is deployed at a worksite, such that communications and protocols inputted from supervising contractor level of access of cloud network 900x will take priority over the protocols inputted directed to portable device 100x at the worksite, i.e., overriding or limiting inputting ability directly actioned on portable device 100x at the worksite. Supervising contractors may also have access to more than one worksite having portable device 100x deployed at each respective worksite. Further, cloud network 900x has an administrative level of access that allows for multiple portable devices to be accessed and controlled at cloud network 900x. Administrative level of access at cloud network 900x has the highest level of priority and will override the inputs placed at the individual worksite supervising contractor level of access of cloud network 900x. Each level of access provides for separate login credentials, whereas a regular contracting employee may only login into cloud network 900x to access their own user profile, using their own personal device, to provide for basic contact information, health information, licensure information, project experience information. The collection of each regular contracting employee's profile may then create the populated list that is uploaded to each worksite and respective portable device 100x. This populated list is used to identify employees for the automated response communication configuration and the check-in communication configuration, detailed supra.

Cloud network 900x has a typical login interface screen that includes a username field, a password field, a "remember me" input that saves the last username, and a "forgot password" input. The username field is associated with a particular individual's email address that is associated with their contact.

Upon successfully logging into cloud network 900x, the user is directed to a primary dashboard. The primary dashboard will be interfaced to correspond with the particular user's credential level, as discussed supra. The primary dashboard with show the portable device's associated projects, or worksites, for supervising contractors and will show all of the deployed portable devices and their respective worksites for administrative users. Employees will have a primary dashboard that shows their respective information, as discussed supra, where they may update or edit their information.

Supervising contractors and administrative users will see each worksite and a plurality of data points for each worksite, e.g., state date, end date, budget, website, address, building use, square footage, number of floors, subterrain floors, elevators, stairwells, portable device 100x serial number, number of cameras (e.g., 600x), number of sensors or scanners (e.g., 510x-514x, 530x-532x, etc.), number of alarms triggered, weather, and a manage project input.

Supervising contractors and administrative users will be able to select a particular worksite from the primary dashboard that directs them to a worksite-specific dashboard via the manage project input. After selecting the manage project input the worksite's dashboard appears showing actionable alarms, workers onsite from the populated lists, sensors operating, and cameras assigned to the project—these fields are preferably located across the top header. Each item can be selected for further detail. The specific portable device can be Armed, Disarmed, or Business Hour Armed from the cloud. The worksite-specific dashboard also shows the weather for the worksite location and quick view graphs of the workers at the project (e.g., Month to Date and Year to Date). The graphs are dynamic and can be detailed by inputting the specific graph. On the left is a menu that gives the particular user the ability to access each component of the portable device deployment, create worker access to the worksite by assigning a tag, view a multitude of reports from the data captured and stored from the communication configurations detailed supra, and manage or create health and safety incident reports from the data captured.

If a user selects the camera option from the left side menu, a quick view of all of the respective camera feeds will appear. These camera feeds may be individually selected to view the live feed of the selected camera deployed. If a user selects the sensor option from the left side menu, an interactive chart of all the sensors and their statuses, e.g., sensor type, enabled status, event messages (triggered/unactive), last event data (time, date), and heartbeat (looping data check to each individual sensor. If a user selects the worker option from the left side menu, the populated list of all the employees on a particular worksite will open. The populated list allows for the user accessing the list to input a message, telephone call or text, to a particular worker, or the entire populated list, as described in the automated response communication configuration, supra.

From the worksite-specific dashboard, a user may select an "alarm" option, sending the user to the alarm interface. This will populate all of the events that were collected from the deployed portable device, e.g., tag scans, sensor triggers, camera detections, etc., and the user can pull out the associated data from each event, e.g., date, time, type, etc. The sensors and cameras deployed on the worksite can be selected to program "If—Then" protocols. For example, if a door, or window, is opened after specific work hours and is detected by a motion sensor deployed at that particular door, or window, cameras that may have a field of view of the particular door, or window, can then be instructed to capture video, or still photos, that will be communicated to the portable device and then communicated to the alarm interface on cloud network 900x. This notification can be further protocoled to trigger the automated response communication configuration to send a communication to a selected list of workers.

Monitoring Camera

Figure 17:
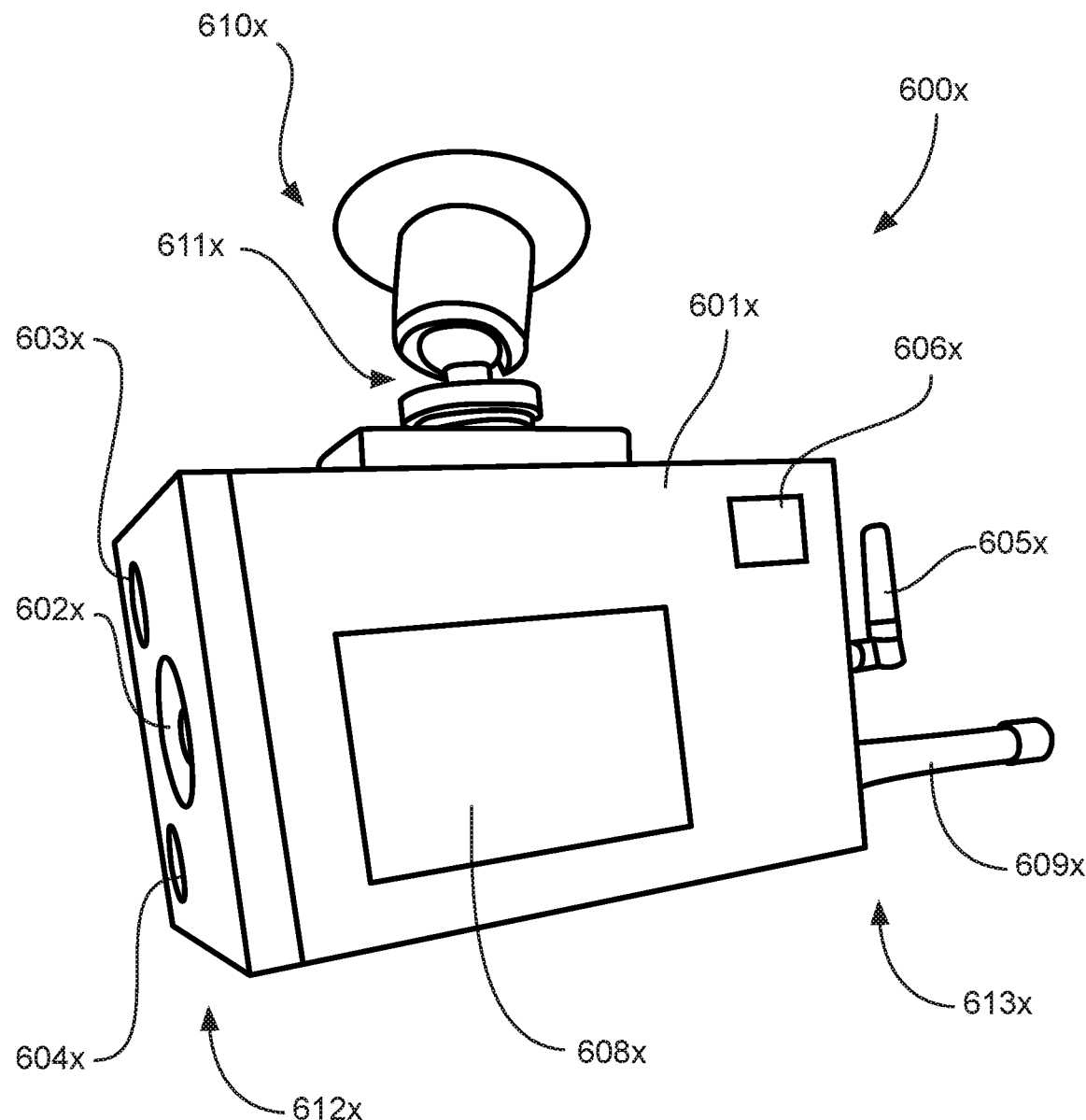
FIG. 17 illustrates a perspective view of monitoring camera 600x.
Figure 18A:
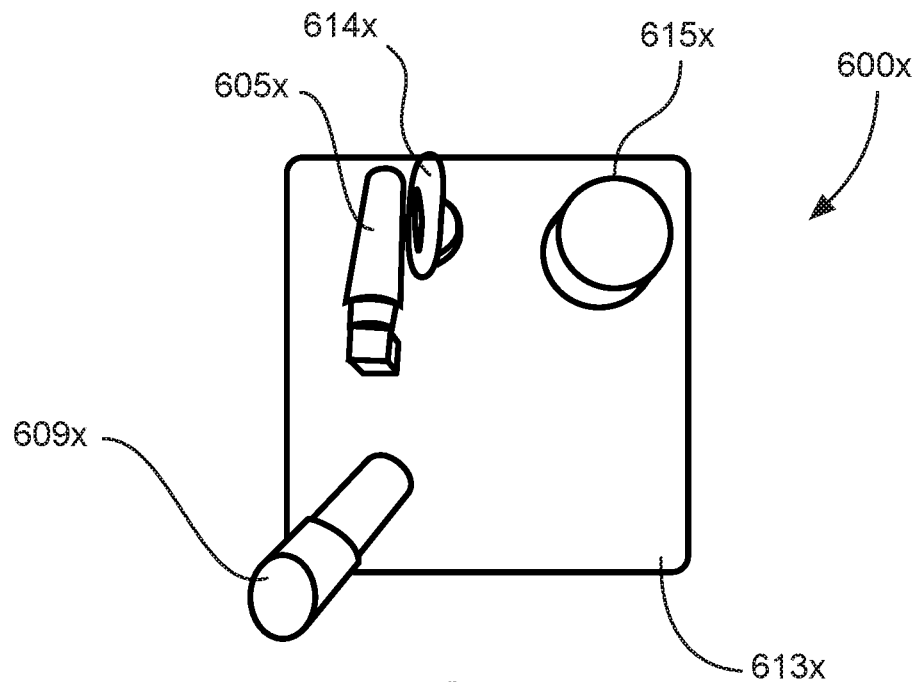
FIG. 18A illustrates a front view from power input end 613x of monitoring camera 600x.
Figure 18B:
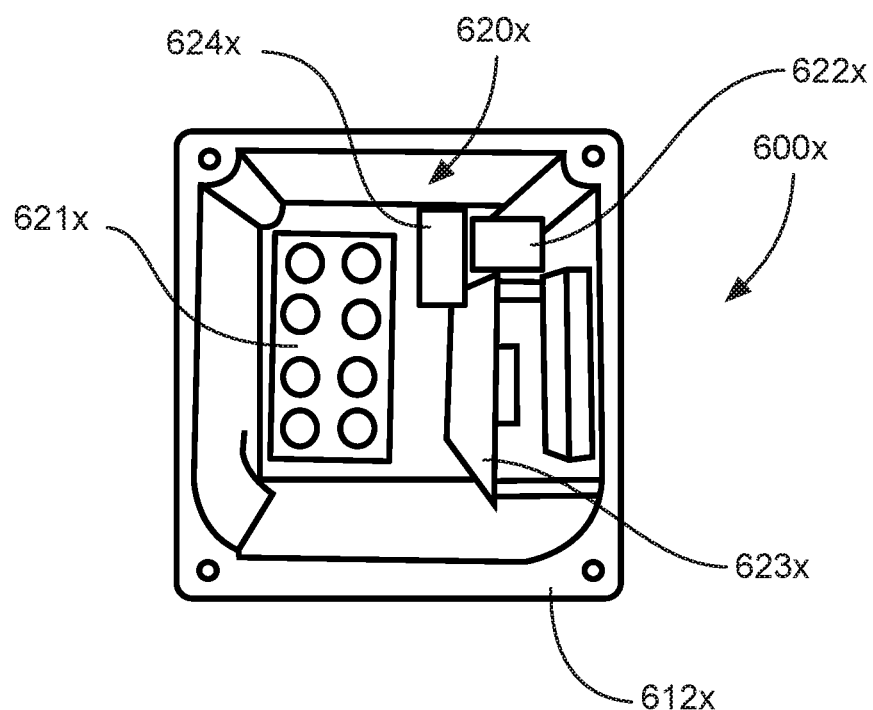
FIG. 18B illustrates an internal view of internal cavity 620x of monitoring camera 600x; and, FIG. 19 illustrates a high-level schematic of monitoring camera 600x.

Adverting now to FIGS. 17-18B, which illustrate monitoring camera 600x. The following description should be taken in view of FIGS. 17-18B. Monitoring camera 600x generally comprises main body 601x that is arranged to house the operating components, mainly camera lens 602x and two infrared projectors 603x and 604x. Camera lens 602x is arranged to be able to record video, capture still images, and provide various levels of zoom, e.g., magnification or fish-eye wide-area field of views. Infrared projectors 603x and 604x provide for video capture from camera lens 602x in low-light circumstances.

Main body 601x has two ends, lens end 612x and power input end 613x. Lens end 612x comprises respective apertures that house camera lens 602x and infrared projectors 603x and 604x. Power input end 613x comprises power input 615x, safety fastener 614x, Wi-Fi antenna 605x, and 345 MgHz antenna 609x. Power input 615x maybe a power over ethernet connector, a serial connector, e.g., RS485 serial interface connectors or RS232 serial interface connectors, a USB connector, or a 12 VDC/24 VDC/48 VDC power connector. Power input 615x also comprises a weatherproof cap that is removable to protect the input from water, moisture, dust, or the like, when not in use. It should also be appreciated that power input 613x not only provides power to monitoring camera 600x but may also be arranged to recharge battery array 621x that is arranged within internal cavity 620x of main body 601x. Safety fastener 614x may be used to attach a fastener to monitoring camera 600x and an external wall to secure camera 600x in the event that magnet 610x fails.

Arranged on the external surface of main body 601x is moisture/humidity sensor 606x. Moisture/humidity sensor 606x may alternatively comprise a temperature sensor. Moisture/humidity sensor 606x is arranged to take the humidity, moisture, temperature of internal cavity 620x and communicate the readings back to computing device 504x of portable device 100x. Also arranged on the external surface of main body 601x is magnetic mount 610x that comprises a high-powered magnet. Magnetic mount 610x magnetically fixes camera 600x to a respective magnetic surface. Universal joint 611x is a rotatory or universal attachment that secures magnetic mount 610x to the external surface of main body 601x. Universal joint 611x allows for the position of camera 600x, specifically the field of view of lens 602x, to be pitched, rotated, and turned to a preferred location to capture video or still photos of a desired area.

The external surface of main body 601x is also arranged to have display 608x. Display 608x is arranged to show the field of view captured by lens 602x and may also include a plurality of buttons, i.e., an on/off button, to conserve battery power of camera 600x when display 608x does not need to be activated.

Communication of the recorded video and/or still photos captured by monitoring camera 600x back to computing device 504x of portable device 100x may be achieved by a plurality of means. As discussed supra, if monitoring camera 600x is connected to plurality of inputs/outputs 111x of portable device 100x via a POE connection, the recorded video feed or captured still photos may be communicated via the POE connection (or serial connection). Alternatively, monitoring camera 600x includes Wi-Fi antenna 605x, which may be communicated over the WAN provided by portable device 100x. Data that is captured by Moisture/humidity sensor 606x may also be communicated back to computing device 504x of portable device 100x by the same protocols described above. Wi-Fi antenna 605x or the POE connection allow camera 600x to communicate with computing device 504x and in turn, via computing device 504x, communicate with cloud network 900x, and vice versa. This communication configuration is best shown in view of FIGS. 13 and 15, discussed supra. This communication configuration also provides for the "If-Then" programming discussed supra.

Extending from power input end 613x is 345 MgHz antenna 609x, which is preferably a transceiver that is arranged to receive radio signals from sensors 513x and 514x, as discussed supra in view of FIG. 15. 345 MgHz antenna 609x allows for worksites to eliminate extraneous transceivers (510x-512x shown in FIG. 12) when a single camera 600x, or a plurality of cameras 600x are deployed at the worksite. Although 345 MgHz antenna 609x is preferably tuned to 345 MgHz, it may utilize the different frequencies that transceiver 506x (shown in FIG. 12) utilizes, as discussed supra.

FIG. 18B shows inside internal cavity 620x of main body 601x, where the face, i.e., lens end 612x, is removed from main body 601x. Battery array 621x is seated within internal cavity 620x and is arranged to provide power to camera 600x in the event camera 600x is deployed without a hardline (POE or serial) connection. Battery array 621x may be recharged via the POE connection, as discussed supra. Micro computing device 622x runs the processes of camera 600x and it should be appreciated that all of the electrical components of camera 600x are in electrical communication with micro computing device 622x. Also included within internal cavity of camera 600x is circuit board 623x and range extender 624x. Although not illustrated, a gas sensor, e.g., smoke, $CO_2$, CO, etc., may also be arranged within internal cavity 620x or alternatively be arranged on the external surface of main body 601x.

The following description references the preferred components of monitoring camera 600x. Wi-Fi antenna 605x in a preferred embodiment is a Fenvi® FV-AX3000 WiFi 6 PCI-E 3000 Mbps Bluetooth 5.1 Wifi Adapter Intel AX200 Wi-fi Card Wireless PCI Express 802.11ax/ac 2.4 Ghz/5.0 Ghz Dual Band MU-MIMO OFDMA With Heat Sink; Item No.: 9SIADXZAWG3073 available from newegg.com. The gas sensor in a preferred embodiment is a Youliang 1PC MQ-2 Gas Sensor Detection Module for Arduino Raspberry Pi; Part No.: MQ-2-1, available at amazon.com. Sensor 606x in a preferred embodiment is a Gowoops DHT22/AM2302 Digital Humidity and Temperature Sensor Module for Arduino Raspberry Pi, Temp Humidity Gauge Monitor Electronic Practice DIY Replace SHT11 SHT15; ASIN No.: B073F472JL, available at amazon.com. Infrared projectors 603x and 604x in a preferred embodiment are DORHEA 2 Pcs Infrared LED Light Board Module for Raspberry Pi Camera Night Vision, 3 W 850 IR High Power Night Vision Infrared Illuminator with Adjustable Resistor for Raspberry Pi Camera; ASIN No.: B07FM6LL3V, available at amazon.com. 345 MgHz antenna 609x may be a Nooelec NESDR Mini SDR & DVB-T USB Stick (RTL2832+R820T) w/Antenna; SKU No.: 100556, available at nooelec.com. Micro computing device 622x in a preferred embodiment is a Raspberry Pi 4 having a USB-C power supply, a plurality of micro HDMI ports, USB 2, USB 3, gigabit ethernet, and a RAM of 2-8 GB, available at https://www.raspberrypi.com/products/raspberry-pi-4-model-b/. Camera 600x may also include a DaierTek® indicator light, specifically model no.: IP671/412v. Lens 602x in a preferred embodiment is a Arducam 5MP Mini Camera OV5647 Sensor 1080p 720p video for Raspberry Pi 4/3B+/3 Camera official Board; SKU No.: B0033, available at https://www.arducam.com/product/arducam-ov5647-standard-raspberry-pi-camera-b0033/. Micro computing device 622x in a preferred embodiment also includes a USB port extension, specifically a AuviPal 3-Port Micro USB OTG Hub Adapter (3 USB Ports+Power Port); ASIN No.: B08GLRC8NC, available at amazon.com. Sensor 606x also includes a probe that provides the humidity and temperature readings to sensor 606x and may be an AC Infinity Controller Sensor Probe, Stainless Steel 20' Waterproof Temperature Humidity Probe; Part No.: AC-SPB20, available at amazon.com. It should also be appreciated that sensor 606x may be fitted with a 3.5 mm jack to accept the probe referenced above. Magnet 610x and universal mount 611x in a preferred embodiment are a ULIBERMAGNET 601b Magnetic Camera Mounting Base with Mini Ball Head; Part No.: ULIMAG-D6608YT-INCH, available at amazon.com. Main body 601x may also include a plurality of ethernet ports that are in communication with micro computing device 622x and may be UMLIFE 2PCS CAT 6 RJ45 Shielded Industrial Panel Mount Bulkhead Feed Thru Coupler with IP67 Waterproof/Dust Cap Ethernet LAN Cable Connector, available at https://www.yoybuy.com/pd/bv0Jc3QBEH5rTAu58hcg.html. It should also be noted that camera 600x may also include a bulkhead connector to support triaxial connections and/or coaxial connections with plurality of inputs/outputs 111x of portable device 100x, should portable device 100x be outfitted with triaxial connections and/or coaxial connections.

Figure 19:
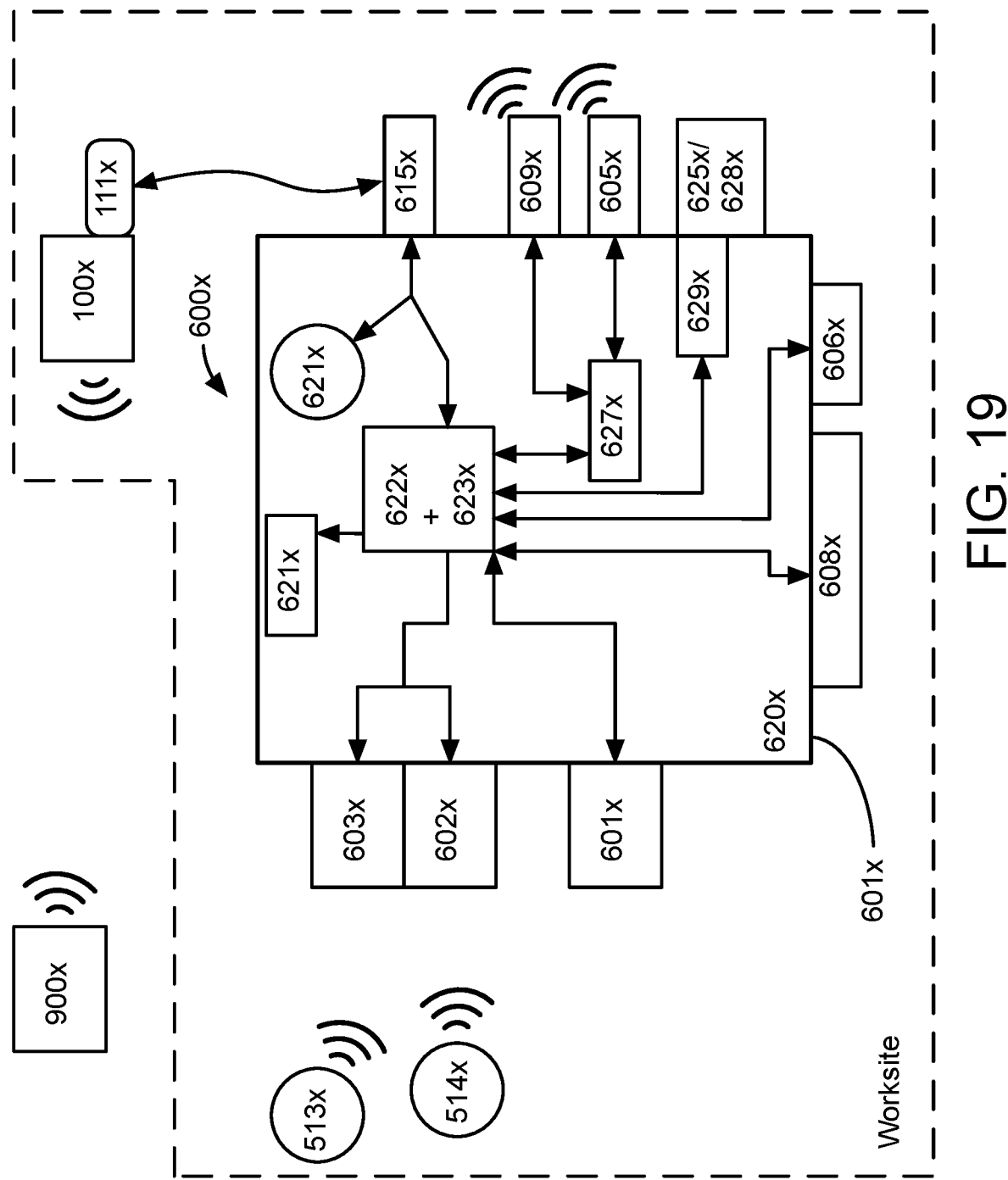

FIG. 19 illustrates a high-level schematic of the components of monitoring camera 600x. Also shown in FIG. 19 is portable device 100x, plurality of input/output connectors 111x of portable device 100x, cloud network 900x, and sensors 513x and 514x. Camera 600x is supplied power from an energized portable device 100x and is shown with power input 615x connected via a POE connection, also providing data transfer between portable device 100x and camera 600x. Power input 615x is in powered communication with battery array 621x such that it may recharge battery array 621x. Power input 615x and battery array 621x are in powered communication with circuit board 623x and micro computing device 622x, whereas power input 615x may also be in data communication with circuit board 622x and micro computing device 623x if a POE connection is used. It should also be appreciated that power input 615x may comprise any combination of, or a plurality of all, of the following connections: ethernet ports, triaxial, coaxial, POE, or USB.

Micro computing device 622x may be programmed with any open source generic coding protocol and combined with a necessary algorithm, that may be used with the Raspberry Pi operating system, or comparable operating system, e.g., Windows®, Apple®, Linux®, to afford video recording, temperature reading, gas sensor reading, radio transceiver communication, Wi-Fi or WAN/LAN communication, live video feed protocols captured by a camera, infrared projection activation, and a plurality of necessary communication protocols to transmit any and all stored information on the memory of micro computing device 622x. It should also be appreciated that circuit board 623x may be configured in a plurality of ways that would support the components shown in FIG. 19 and is merely exemplary, i.e., a plurality of circuit boards and configurations may be contemplated.

Micro computing device 622x has a plurality of inputs and outputs, as described supra, and is in communication with USB connection extender 629x to connect to Wi-Fi antenna 605x and 345 MgHz Antenna 609x. Micro computing device 622x and circuit board 623x are in communication and supply power to infrared projectors 602x and 603x, camera lens 601x, display 608x, and humidity/temperature sensor 606x. In connection with circuit board 623x is indicator light 621x which is arranged to provide a visual indication of functionality, failure, alerts, etc. Also, in connection with micro computing device 622x and circuit board 623x is connectors 629x which is arranged to connect gas sensor 625x and probe 628x (which may be for temperature and/or humidity) to micro computing device 622x and circuit board 623x. It should also be noted that a range extending antenna may also be coupled with either Wi-Fi antenna 605x and/or 345 MgHz Antenna 609x.

Although camera 600x is in POE connection with portable device 100x, it is contemplated that power input 615x may only supply power and may not provide data communication, that is, power input 615x is a serial connection, coaxial connection, and/or triaxial connection, and may be connected to an independent power supply located on the worksite. In the event that power input 615x only supplies power, Wi-Fi antenna 605x would provide for the communication of data over the WAN and/or LAN to portable device 100x. Portable device 100x would communicate the data received via the WAN and/or LAN or by cellular network to cloud network 900x and vice versa.

FIG. 19 also illustrates the communication configuration, i.e., the alternative embodiment of the environmental detection communication configuration shown in FIG. 15. Monitoring camera 600x uses 345 MgHz Antenna 609x to communicate alarms 513x and 514x and communicate those to with radio transceiver 506x of portable device 100x.

The description of the present invention has been presented for purposes of illustration and description but is not intended to be exhaustive or limited to the invention in the form disclosed. Many modifications and variations will be apparent to those of ordinary skill in the art without departing from the scope and spirit of the invention.

The embodiments were chosen and described in order to best explain the principles of the invention and the practical application, and to enable others of ordinary skill in the art to understand the invention for various embodiments with various modifications as are suited to the particular use contemplated. The present invention according to one or more embodiments described in the present description may be practiced with modification and alteration within the spirit and scope of the appended claims. Thus, the description is to be regarded as illustrative instead of restrictive of the present invention.

REFERENCE NUMERALS

100x Portable monitoring and sensing device
101x Main body of portable monitoring and communication device 100x
102x Lid of portable monitoring and sensing device 100x
103x First lockable means of portable monitoring and communication device 100x
104x Second lockable portable monitoring and communication device 100x
105x Handle of portable monitoring and communication device 100x
106x First latch of lid 102x
108x Second latch of lid 102x
110x Plurality of indicator lights
111x Plurality of input/output connectors
112x Power supply input
113x Bottom surface of main body 101x
114x Sidewall of main body 101x
115x Siren
120x Heat sink channel of main body 101x
121x Mesh cover of heat sink channel 120x
130x Seal of heat sink channel 120x
200x Display
201x Power button
202x Plurality of buttons of display 200x
203x Secondary display
204x Internal indicator light
210x Display panel
300x Heat sink apparatus of portable monitoring and communication device 100x
301x U-shaped channel of heat sink apparatus 300x
302x First shelf of U-shaped channel 301x
303x Second shelf of U-shaped channel 301x
304x First sidewall of U-shaped channel 301x
305x Second sidewall of U-shaped channel 301x
306x Mounting plate of U-shaped channel 301x
307x Internal surface of U-shaped channel 301x
308x External surface U-shaped channel 301x
310x Channel cover
320x Mounting cleat
401x First heat management apparatus
402x Second heat management apparatus
403x Ambient air blower/fan
421x Heat pipe radiator of first heat management apparatus 401x
422x Plurality of heat pipes of heat pipe radiator 421x
423x Heatsink of heat pipe radiator 421x
424x Mounting plate of heat pipe radiator 421x
425x Heat pipe radiator of second heat management apparatus 402x
426x Plurality of heat pipes of heat pipe radiator 425x
427x Heatsink of heat pipe radiator 425x
428x Mounting plate of heat pipe radiator 425x
431x Heat pipe radiator of first heat management apparatus 401x
432x Plurality of heat pipes of heat pipe radiator 431x
433x Heatsink of heat pipe radiator 431x
434x Mounting plate of heat pipe radiator 431x
435x Heat pipe radiator of second heat management apparatus 402x
436x Plurality of heat pipes of heat pipe radiator 435x
437x Heatsink of heat pipe radiator 435x
438x Mounting plate of heat pipe radiator 435x
441x Fan of heat pipe radiator 421x
442x Fan of heat pipe radiator 425x
470x Thermal switch
501x Step up board
502x Power over ethernet switch
503x Power supply
504x Computing device
505x Modem
506x Transceiver
507x Wi-Fi radio
508x Storage
509x Logic board
510x External transceiver
511x External transceiver
512x External transceiver
513x External alarm
514x External alarm
520x External transceiver cascade
530x Tag scanner
531x Tag
532x Tag
540x Cellphone
541x Cellphone
542x Cellphone
600x Monitoring camera
601x Main body of monitoring camera 600x
602x Camera Lens
603x Infrared projector
604x Infrared projector
605x Wi-Fi antenna
606x Humidity/Temperature sensor
608x Display screen
609x 345 MgHz Antenna
610x Magnetic mount
611x Universal joint of magnetic mount 610x
612x Lens end of main body 601x
613x Power input end of main body 601x
614x Safety fastener
615x Power input
620x Internal cavity of main body 601x
621x Battery array 622x Micro computing device
623x Circuit board
624x Range extender
625x Gas sensor
626x Indicator light
627x USB connection extender
628x Probe of 606x
629x Connectors for 625x or 628x
800x 120 VAC power supply
900x Cloud network

What is claimed is:

1. A portable worksite monitoring and communication device, comprising:
    a weatherproof sealed container, further comprising;
        a container portion having an internal cavity, a removable cover arranged to lockably seal said internal cavity, and a heat sink opening;
        a heat sink apparatus sealably secured within said heat sink opening, said heat sink apparatus comprising:
            a U-shaped channel having an inner surface and an external surface, said U-shaped channel having a pair of shelves extending therefrom, said pair of shelves arranged to sealably secure to a bottom surface of said container;
            at least one heat management apparatus fixedly secured to said U-shaped channel; and,
            a blower fixedly secured to said external surface of said U-shaped channel, said blower positioned away from said at least one heat management apparatus, said blower is in communication with a thermal switch, said thermal switch in communication with said computing device and a logic board, said logic board in communication with said computing device,
        wherein said thermal switch is arranged to turn on said blower in response to internal temperature changes within said sealed container, said thermal switch is arranged to turn on said blower in response to communications from said logic board, and,
        wherein said blower is arranged to move air towards said at least one heat management apparatus; and,
        a plurality of electronic connectors;
    a computing device in communication with a cellular modem, said cellular modem in communication with a cloud network, said computing device in communication with said plurality of electronic connectors;
    a display in communication with said computing device; and,
    a plurality of communication configurations in communication with said computing device,
    wherein said heat sink apparatus is arranged to programmably activate or automatically activate.

2. The portable worksite monitoring and communication device recited in claim 1, wherein said plurality of communication configurations comprises:
    a first communication configuration having a radio transceiver, said radio transceiver in communication with said computing device, wherein said radio transceiver is in communication with at least one external alarm;
    a second communication configuration having a Wi-Fi radio and a power over ethernet, said Wi-Fi radio in communication with said cellular modem and said computing device, said computing device in communication with said power over ethernet, wherein said Wi-Fi radio and said power over ethernet is in communication with at least one monitoring camera; and,
    a third communication configuration having said Wi-Fi radio, said power over ethernet, and a serial connection, said Wi-Fi radio in communication with said computing device, said computing device in communication with said power over ethernet, said serial connection in communication with said computing device, wherein said power over ethernet or said serial connection and said Wi-Fi radio is in communication with at least one tag scanner.

3. The portable worksite monitoring and communication device recited in claim 2, wherein said first communication configuration may further include at least one external radio transceiver in communication with said radio transceiver, said at least one alarm in communication with said at least one external radio transceiver.

4. The portable worksite monitoring and communication device recited in claim 2, wherein said second communication configuration said at least one monitoring camera includes an onboard radio transceiver, said onboard radio transceiver in communication with said at least one external alarm.

5. The portable worksite monitoring and communication device recited in claim 2, wherein said third communication configuration may further include at least one tag arranged to be read said at least one tag scanner.

6. The portable worksite monitoring and communication device recited in claim 1, wherein each of said at least one heat management apparatus comprises:
    an internal mounting surface fixedly secured to said inner surface of said U-shaped channel and an external mounting surface fixedly secured to said external surface of said U-shaped channel;
    a plurality of internal heat tubes extending from said internal mounting surface and a plurality of external heat tubes extending from said external mounting surface;
    said internal heat tubes merge into an internal radiator unit and said external heat tubes merge into an external coil unit; and,
    an internal fan fixedly secured to said internal radiator unit, said internal fan is in communication with said computing device,
    wherein said internal fan is arranged to constantly run.

7. A portable worksite monitoring and communication device, comprising:
    a weatherproof sealed container, further comprising;
        a container portion having an internal cavity, and a main opening;
        a removable cover arranged to lockably seal said main opening;
        a heat sink opening arranged on said container portion; and,
        a heat sink apparatus sealably secured within said heat sink opening, wherein said heat sink apparatus is arranged to programmably activate or automatically activate, said heat sink apparatus comprising:
            a U-shaped channel having an inner surface and an external surface, said U-shaped channel having a pair of shelves extending therefrom, said pair of shelves arranged to sealably secure to a bottom surface of said container;
            at least one heat management apparatus fixedly secured to said U-shaped channel; and,
            a blower fixedly secured to said external surface of said U-shaped channel, said blower positioned away from said at least one heat management apparatus, said blower is in communication with a thermal switch, said thermal switch in communication with said computing device and a logic board, said logic board in communication with said computing device, wherein said thermal switch is arranged to turn on said blower in response to internal temperature changes within said sealed container, said thermal switch is arranged to turn on said blower in response to communications from said logic board, and, wherein said blower is arranged to move air towards said at least one heat management apparatus; and, a plurality of electronic connectors;

a computing device in communication with a network interface, said network interface in communication with a cloud network, said computing device in communication with said plurality of electronic connectors;

a display in communication with said computing device; and, a plurality of communication configurations in communication with said computing device.

8. The portable worksite monitoring and communication device recited in claim 7, wherein said weatherproof sealed container has a maximum dimension of approximately 15"×8.25"×19".

9. The portable worksite monitoring and communication device recited in claim 7, wherein said plurality of communication configurations comprises:

a first communication configuration having a radio transceiver, said radio transceiver in communication with said computing device, wherein said radio transceiver is in communication with at least one external alarm, wherein said first communication configuration may further include at least one external radio transceiver in communication with said radio transceiver, said at least one alarm in communication with said at least one external radio transceiver;

a second communication configuration having a Wi-Fi radio and a power over ethernet, said Wi-Fi radio in communication with said network interface and said computing device, said computing device in communication with said power over ethernet, wherein said Wi-Fi radio and said power over ethernet is in communication with at least one monitoring camera, wherein said second communication configuration said at least one monitoring camera includes an onboard radio transceiver, said onboard radio transceiver in communication with said at least one external alarm; and, a third communication configuration having said Wi-Fi radio, said power over ethernet, and a serial connection, said Wi-Fi radio in communication with said computing device, said computing device in communication with said power over ethernet, said serial connection in communication with said computing device, wherein said power over ethernet or said serial connection and said Wi-Fi radio is in communication with at least one tag scanner, wherein said third communication configuration may further include at least one tag arranged to be read said at least one tag scanner.

10. The portable worksite monitoring and communication device recited in claim 7, wherein each of said at least one heat management apparatus comprises:

an internal mounting surface fixedly secured to said inner surface of said U-shaped channel and an external mounting surface fixedly secured to said external surface of said U-shaped channel;

a plurality of internal heat tubes extending from said internal mounting surface and a plurality of external heat tubes extending from said external mounting surface;

said internal heat tubes merge into an internal radiator unit and said external heat tubes merge into an external coil unit; and, an internal fan fixedly secured to said internal radiator unit, said internal fan is in communication with said computing device, wherein said internal fan is arranged to constantly run.

11. A portable worksite monitoring and communication device, comprising:

a weatherproof sealed container having a maximum dimension of approximately 15"×8.25"×19", said weatherproof container further comprising an internal cavity, a heat sink opening, and a heat sink apparatus sealably secured within said heat sink opening, said heat sink apparatus comprising:

a U-shaped channel having an inner surface and an external surface, said U-shaped channel having a pair of shelves extending therefrom, said pair of shelves arranged to sealably secure to a surface of said container;

at least one heat management apparatus fixedly secured to said U-shaped channel; and, blower fixedly secured to said external surface of said U-shaped channel, said blower positioned away from said at least one heat management apparatus, said blower is in communication with a thermal switch, said thermal switch in communication with said computing device and a logic board, said logic board in communication with said computing device, wherein said thermal switch is arranged to turn on said blower in response to internal temperature changes within said sealed container, said thermal switch is arranged to turn on said blower in response to communications from said logic board, and, wherein said blower is arranged to move air towards said at least one heat management apparatus; and, a computing device arranged within said internal cavity in communication with a cellular modem, said cellular modem in communication with a cloud network, a display in communication with said computing device, said computing device in communication with said heat sink apparatus, wherein said computing device is arranged to initiate a plurality of communication configurations from a direct input from said display or an input communicated from said cloud network.

12. The portable worksite monitoring and communication device recited in claim 11, wherein said plurality of communication configurations comprises:

a first communication configuration having a radio transceiver, said radio transceiver in communication with said computing device, wherein said radio transceiver is in communication with at least one external alarm, wherein said first communication configuration may further include at least one external radio transceiver in communication with said radio transceiver, said at least one alarm in communication with said at least one external radio transceiver;

a second communication configuration having a Wi-Fi radio and a power over ethernet, said Wi-Fi radio in communication with said cellular modem and said computing device, said computing device in communication with said power over ethernet, wherein said Wi-Fi radio and said power over ethernet is in communication with at least one monitoring camera, wherein said second communication configuration said at least one monitoring camera includes an onboard radio transceiver, said onboard radio transceiver in communication with said at least one external alarm; and, a third communication configuration having said Wi-Fi radio, said power over ethernet, and a serial connection, said Wi-Fi radio in communication with said computing device, said computing device in communication with said power over ethernet, said serial connection in communication with said computing device, wherein said power over ethernet or said serial connection and said Wi-Fi radio is in communication with at least one tag scanner, wherein said third communication configuration may further include at least one tag arranged to be read said at least one tag scanner.

13. The portable worksite monitoring and communication device recited in claim 11, wherein each of said at least one heat management apparatus comprises:

an internal mounting surface fixedly secured to said inner surface of said U-shaped channel and an external mounting surface fixedly secured to said external surface of said U-shaped channel;

a plurality of internal heat tubes extending from said internal mounting surface and a plurality of external heat tubes extending from said external mounting surface;

said internal heat tubes merge into an internal radiator unit and said external heat tubes merge into an external coil unit; and, an internal fan fixedly secured to said internal radiator unit, said internal fan is in communication with said computing device, wherein said internal fan is arranged to constantly run.

\* \* \* \* \*